(12) United States Patent
Takahashi et al.

(10) Patent No.: US 9,515,080 B2
(45) Date of Patent: Dec. 6, 2016

(54) VERTICAL NAND AND METHOD OF MAKING THEREOF USING SEQUENTIAL STACK ETCHING AND LANDING PAD

(71) Applicant: SanDisk Technologies, Inc., Plano, TX (US)

(72) Inventors: Akira Takahashi, Yokkaichi (JP); Chi-Ming Wang, Milpitas, CA (US); Johann Alsmeier, San Jose, CA (US); Henry Chien, San Jose, CA (US); Xiying Costa, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 24 days.

(21) Appl. No.: 14/207,012

(22) Filed: Mar. 12, 2014

(65) Prior Publication Data
US 2014/0264525 A1    Sep. 18, 2014

Related U.S. Application Data

(63) Continuation of application No. PCT/US2014/023276, filed on Mar. 11, 2014.

(60) Provisional application No. 61/776,953, filed on Mar. 12, 2013.

(51) Int. Cl.
*H01L 29/76* (2006.01)
*H01L 27/115* (2006.01)
(Continued)

(52) U.S. Cl.
CPC ....... *H01L 27/11563* (2013.01); *H01L 27/115* (2013.01); *H01L 27/11556* (2013.01);
(Continued)

(58) Field of Classification Search
CPC .......... H01L 27/115; H01L 27/11563; H01L 27/11582; H01L 29/66825; H01L 29/66833; H01L 29/7889; H01L 29/7926; H01L 27/11556
See application file for complete search history.

(56) References Cited

U.S. PATENT DOCUMENTS 5,387,530 A    2/1995  Doyle et al.
7,177,191 B2   2/2007  Fasoli et al.
(Continued)

FOREIGN PATENT DOCUMENTS

EP    1398831 A2    3/2004
WO    WO02/15277 A2   2/2002
(Continued)

OTHER PUBLICATIONS

International Search Report & Written Opinion received in connection with international application No. PCT/US2014/023276, mailed Jun. 30, 2014.
(Continued)

*Primary Examiner* — Phat X Cao
*Assistant Examiner* — Mohammad M Hoque
(74) *Attorney, Agent, or Firm* — The Marbury Law Group PLLC

(57) ABSTRACT

A vertical NAND string device includes a semiconductor channel, where at least one end portion of the semiconductor channel extends substantially perpendicular to a major surface of a substrate, at least one semiconductor or electrically conductive landing pad embedded in the semiconductor channel, a tunnel dielectric located adjacent to the semiconductor channel, a charge storage region located adjacent to the tunnel dielectric, a blocking dielectric located adjacent to the charge storage region and a plurality of control gate electrodes extending substantially parallel to the major surface of the substrate.

22 Claims, 36 Drawing Sheets

(51) Int. Cl.
  *H01L 29/66* (2006.01)
  *H01L 29/788* (2006.01)
  *H01L 29/792* (2006.01)
(52) U.S. Cl.
  CPC ... *H01L27/11582* (2013.01); *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | | |
|---|---|---|---|
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,193,054 B2 | 6/2012 | Alsmeier | |
| 8,198,672 B2 | 6/2012 | Alsmeier | |
| 8,349,681 B2 | 1/2013 | Alsmeier et al. | |
| 8,394,716 B2* | 3/2013 | Hwang | H01L 27/11551 257/315 |
| 8,445,347 B2 | 5/2013 | Alsmeier | |
| 8,450,181 B2 | 5/2013 | Chen et al. | |
| 8,614,126 B1 | 12/2013 | Lee et al. | |
| 8,658,499 B2 | 2/2014 | Makala et al. | |
| 8,741,761 B2 | 6/2014 | Lee et al. | |
| 2004/0113190 A1* | 6/2004 | Oh | H01L 21/76801 257/296 |
| 2006/0003531 A1 | 1/2006 | Chang et al. | |
| 2006/0258076 A1 | 11/2006 | Mizushima et al. | |
| 2007/0210338 A1 | 9/2007 | Orlowski | |
| 2007/0252201 A1 | 11/2007 | Kito et al. | |
| 2008/0067583 A1 | 3/2008 | Kidoh et al. | |
| 2008/0169496 A1 | 7/2008 | Keller et al. | |
| 2009/0026561 A1 | 1/2009 | Reichenbach et al. | |
| 2009/0121271 A1 | 5/2009 | Son et al. | |
| 2009/0242967 A1 | 10/2009 | Katsumata et al. | |
| 2010/0044778 A1 | 2/2010 | Seol | |
| 2010/0059811 A1 | 3/2010 | Sekine et al. | |
| 2010/0109065 A1* | 5/2010 | Oh | H01L 27/0688 257/314 |
| 2010/0112769 A1 | 5/2010 | Son et al. | |
| 2010/0120214 A1 | 5/2010 | Park et al. | |
| 2010/0155810 A1* | 6/2010 | Kim | H01L 27/11548 257/316 |
| 2010/0155818 A1 | 6/2010 | Cho | |
| 2010/0171162 A1 | 7/2010 | Katsumata et al. | |
| 2010/0181610 A1 | 7/2010 | Kim et al. | |
| 2010/0207195 A1 | 8/2010 | Fukuzumi et al. | |
| 2010/0213458 A1 | 8/2010 | Prall | |
| 2010/0320528 A1 | 12/2010 | Jeong et al. | |
| 2011/0002178 A1* | 1/2011 | Hwang | H01L 27/11578 365/189.011 |
| 2011/0065270 A1* | 3/2011 | Shim | H01L 27/11556 438/589 |
| 2011/0076819 A1 | 3/2011 | Kim et al. | |
| 2011/0133606 A1 | 6/2011 | Yoshida et al. | |
| 2011/0163449 A1* | 7/2011 | Kelly | H01L 21/2885 257/750 |
| 2011/0266606 A1 | 11/2011 | Park et al. | |
| 2011/0287612 A1 | 11/2011 | Lee et al. | |
| 2011/0312174 A1 | 12/2011 | Lee et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0003800 A1* | 1/2012 | Lee | H01L 27/11551 438/261 |
| 2012/0052674 A1 | 3/2012 | Lee et al. | |
| 2012/0068242 A1 | 3/2012 | Shin et al. | |
| 2012/0074367 A1 | 3/2012 | Costa et al. | |
| 2012/0140562 A1* | 6/2012 | Choe | H01L 27/1157 365/185.18 |
| 2012/0153376 A1 | 6/2012 | Alsmeier et al. | |
| 2012/0256247 A1 | 10/2012 | Alsmeier et al. | |
| 2012/0261638 A1 | 10/2012 | Sills et al. | |
| 2012/0276719 A1 | 11/2012 | Han et al. | |
| 2013/0044531 A1* | 2/2013 | Baek | G11C 5/025 365/72 |
| 2013/0059422 A1 | 3/2013 | Lee et al. | |
| 2013/0248974 A1 | 9/2013 | Alsmeier et al. | |
| 2013/0264631 A1 | 10/2013 | Alsmeier et al. | |
| 2013/0313627 A1 | 11/2013 | Lee et al. | |
| 2013/0313717 A1 | 11/2013 | Holmes et al. | |
| 2013/0322174 A1 | 12/2013 | Li et al. | |
| 2014/0008714 A1 | 1/2014 | Makala et al. | |
| 2014/0264525 A1 | 9/2014 | Takahashi et al. | |

FOREIGN PATENT DOCUMENTS

| | | |
|---|---|---|
| WO | WO 2008/118433 A1 | 10/2008 |
| WO | WO2009/085078 A1 | 7/2009 |
| WO | WO2012/003301 A2 | 1/2012 |

OTHER PUBLICATIONS

International Search Report & Written Opinion received in connection with international application No. PCT/US2014/020290, mailed Jun. 25, 2014.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.ip/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Invitation to Pay Additional Search Fees, International Application No. PCT/US13/24638, issued Apr. 24, 2013.

Miller et al., "On the conformations of poly(p-xylylene) and its mesophase transitions," Macromolecules 1990 23 (16), 3855-3859.

Boogaard et al., "Net negative charge in low-temperature SiO2 gate dielectric layers," Microelectronic Engineering, vol. 86, Issues 7-9, Jul.-Sep. 2009, pp. 1707-1710.

U.S. Appl. No. 13/933,743, "Method of Making a Vertical NAND Device Using Sequential Etching of Multilayer Stacks," filed Jul. 2, 2013, Makala et al., Specification and drawings, 101pgs.

(56) References Cited

OTHER PUBLICATIONS

U.S. Appl. No. 14/219,161, "Vertical NAND and Method of Making Thereof Using Sequential Stack Etching and Landing Pad," filed Mar. 19, 2014, Wang et al., Specification and drawings, 88pgs.
U.S. Appl. No. 13/933,743, Office Action issued Apr. 21, 2014, 29pgs.
U.S. Appl. No. 14/219,161, Office Action, dated Jul. 28, 2014, 18pgs.
PTO Office Communication for U.S. Appl. No. 14/748,808, dated Feb. 26, 2016, 16 pages.
International Preliminary Report on Patentability and Written Opinion of the International Search Authority for PCT/US2014/020290, mailed Sep. 24, 2015, 7 pages.

* cited by examiner

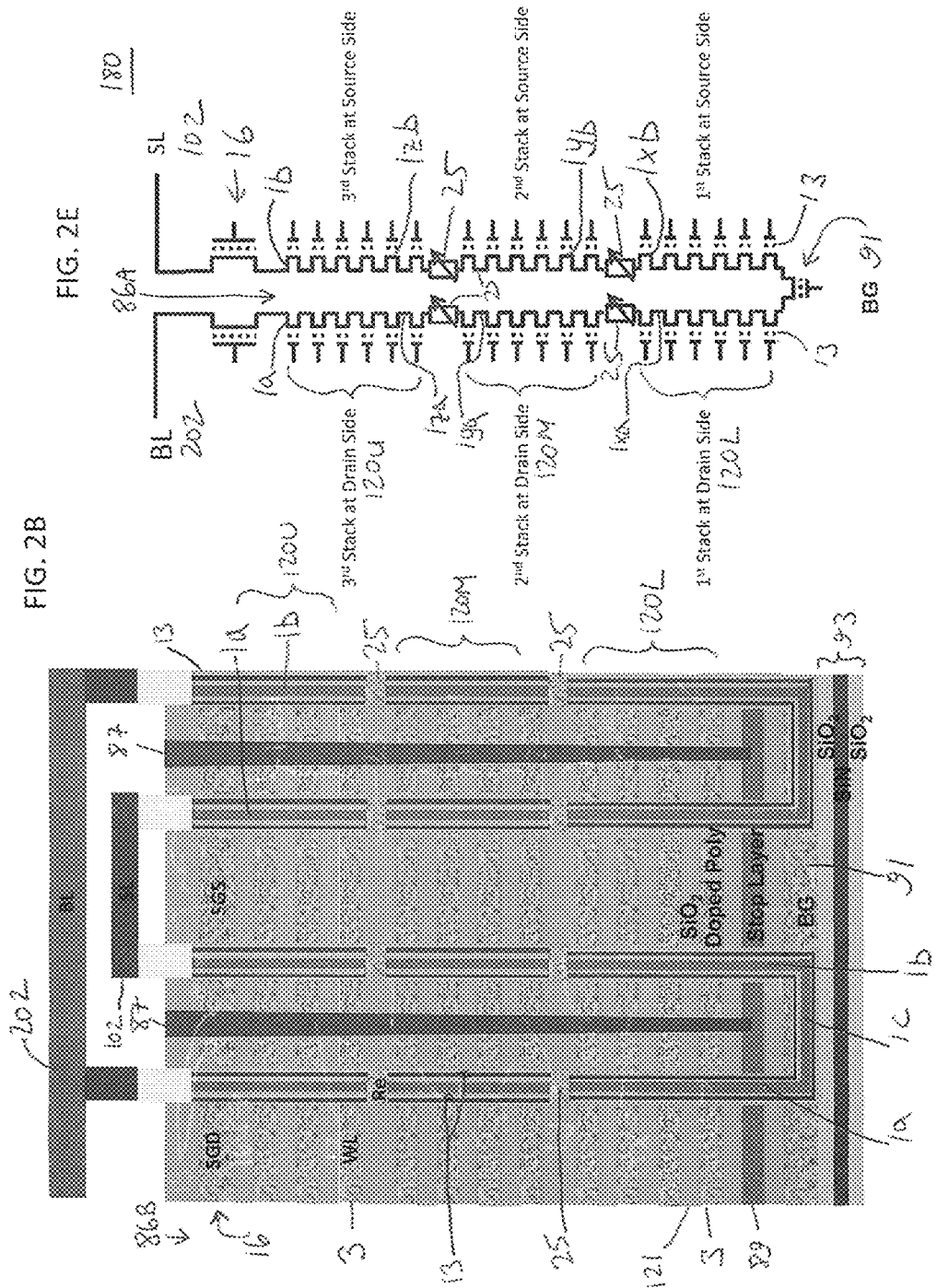

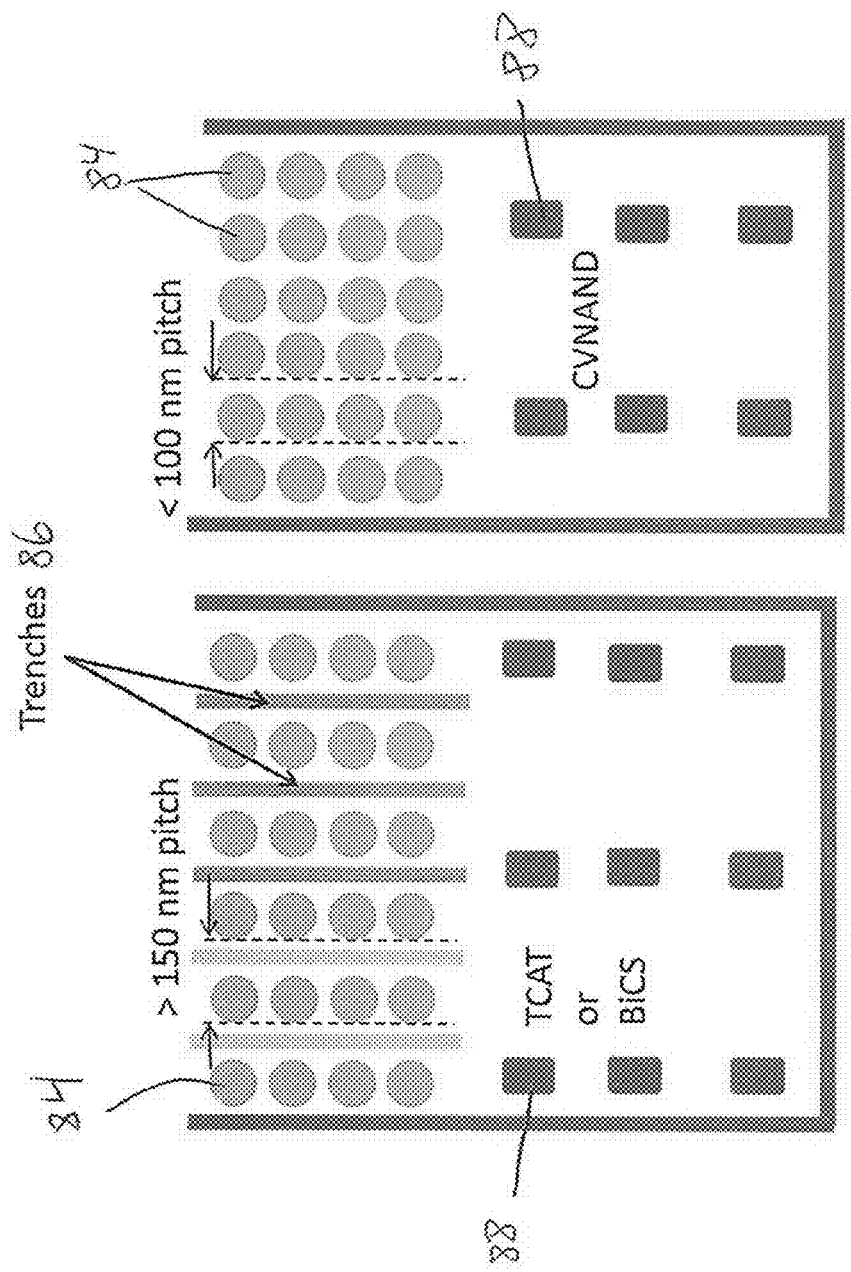

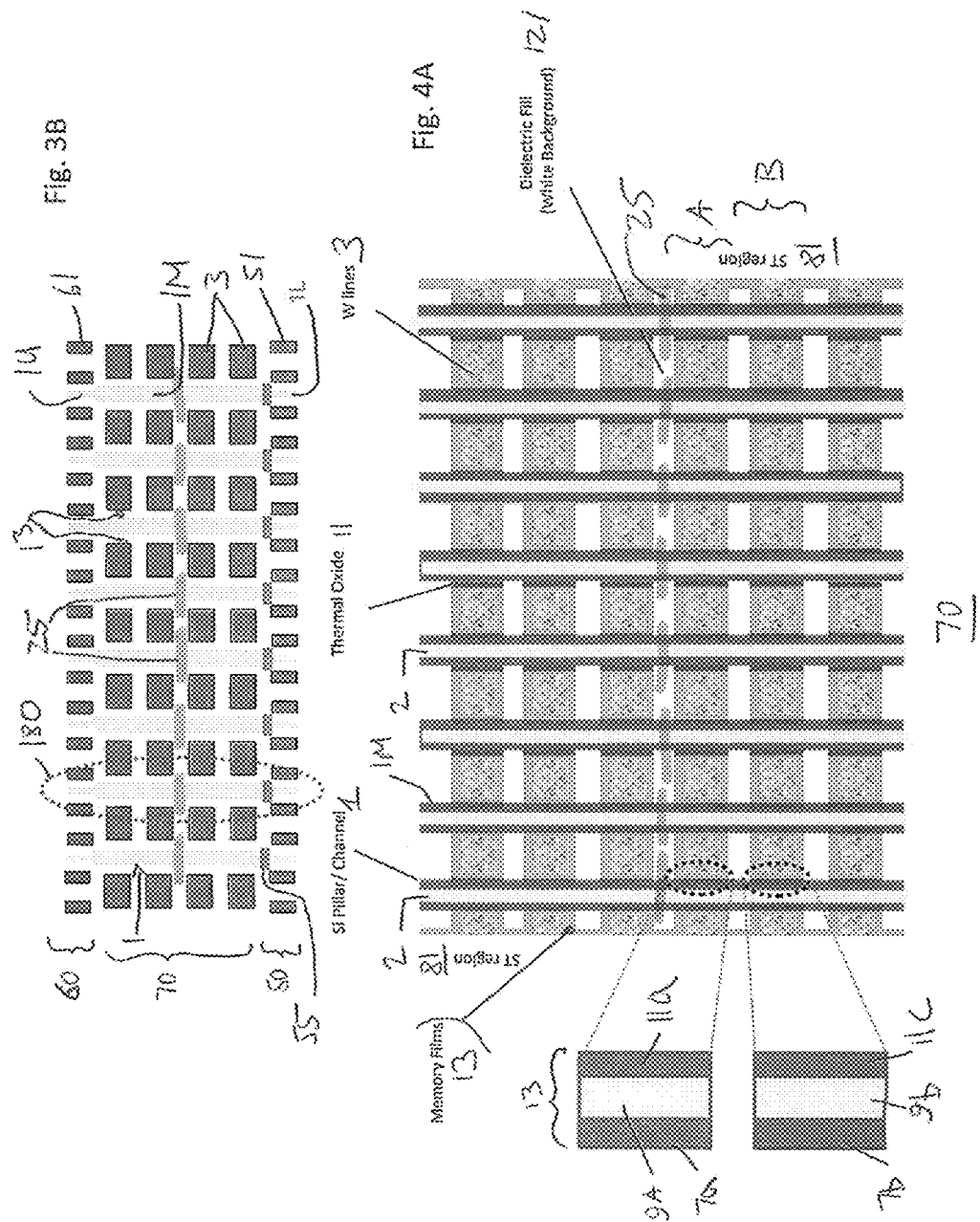

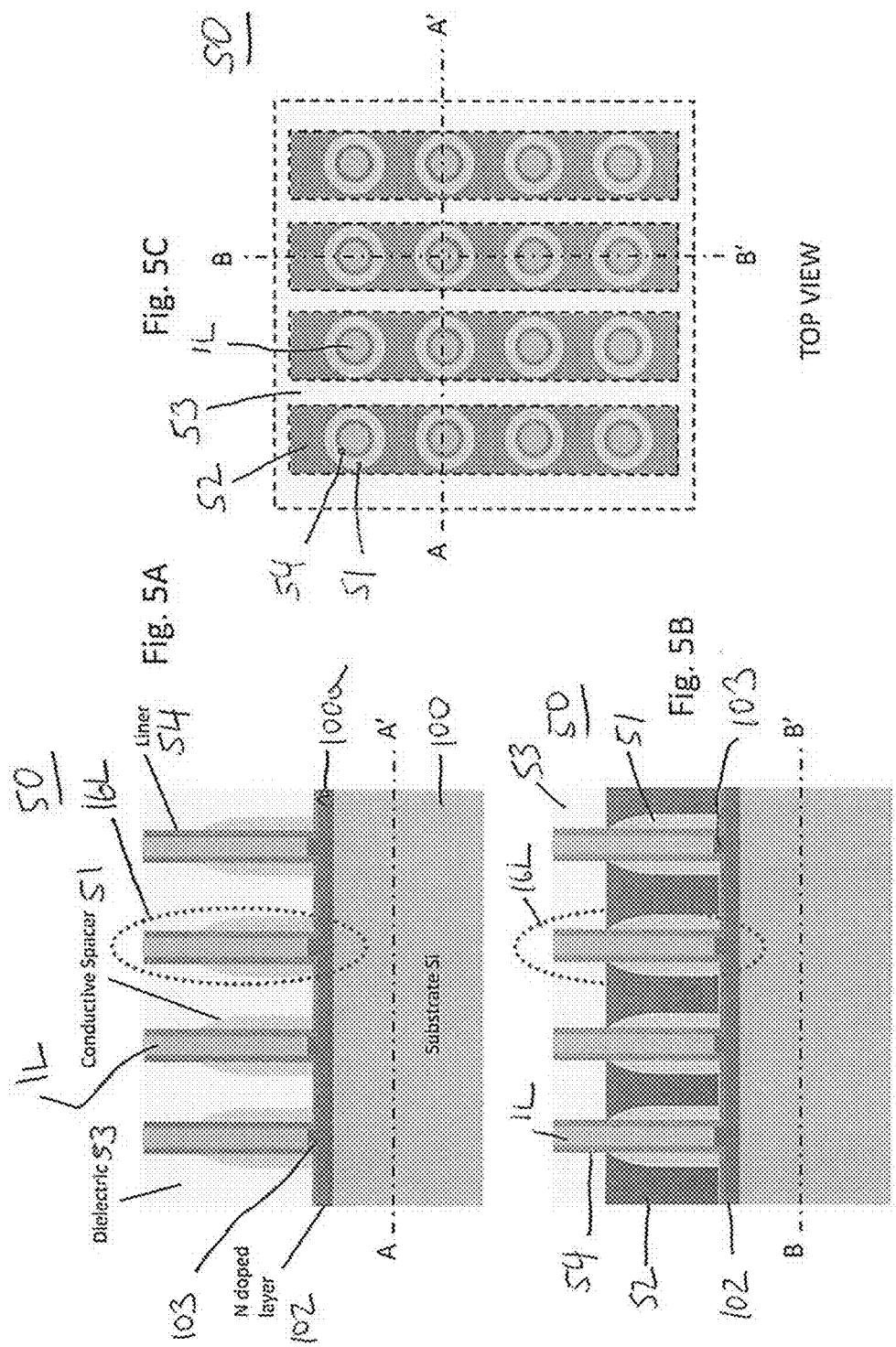

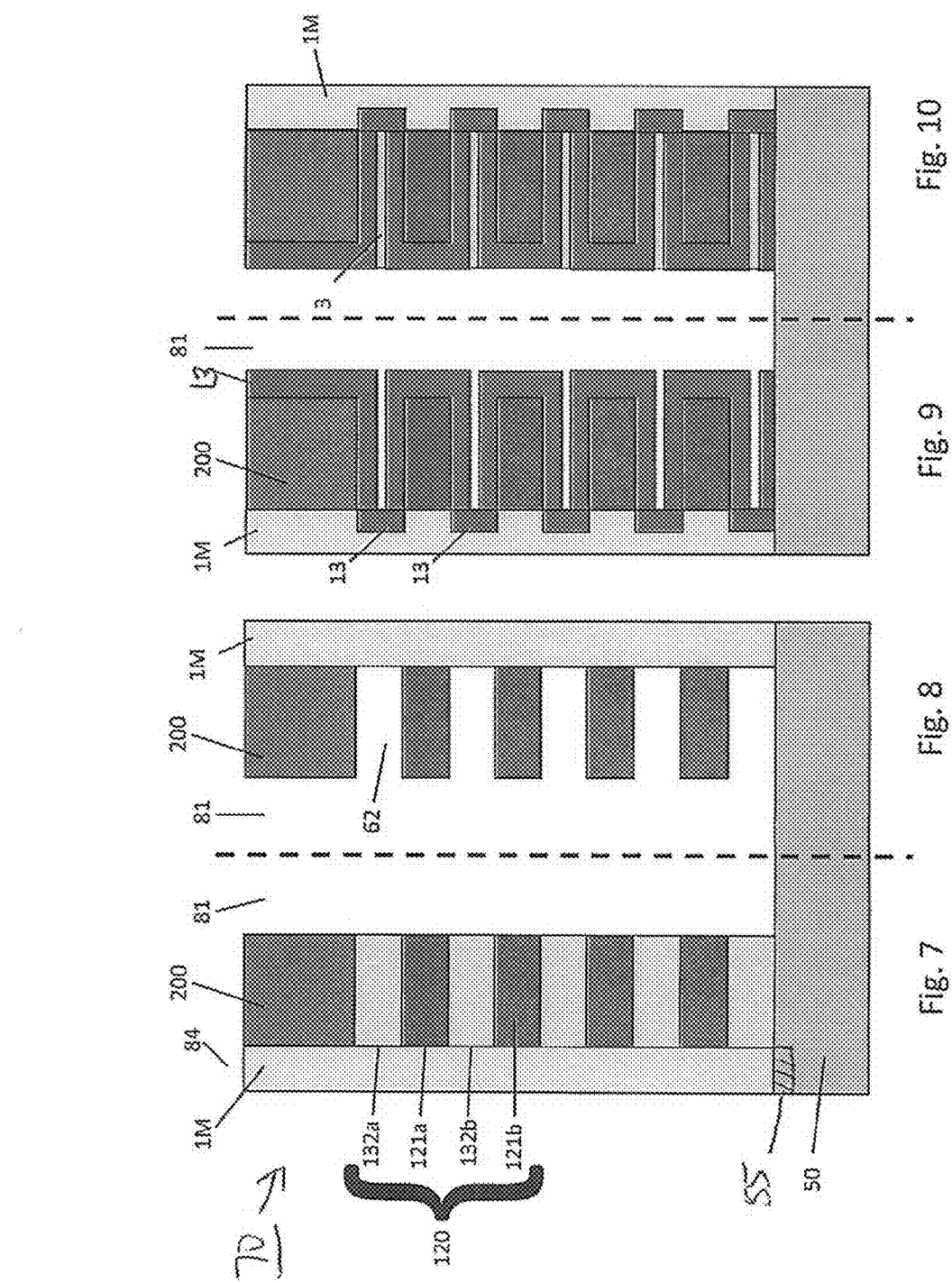

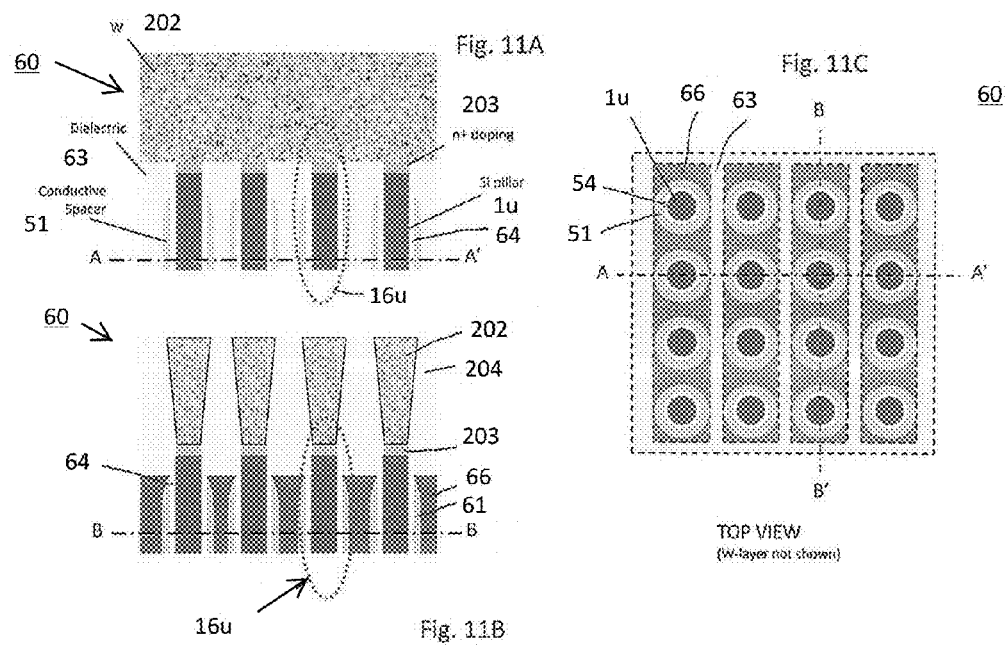

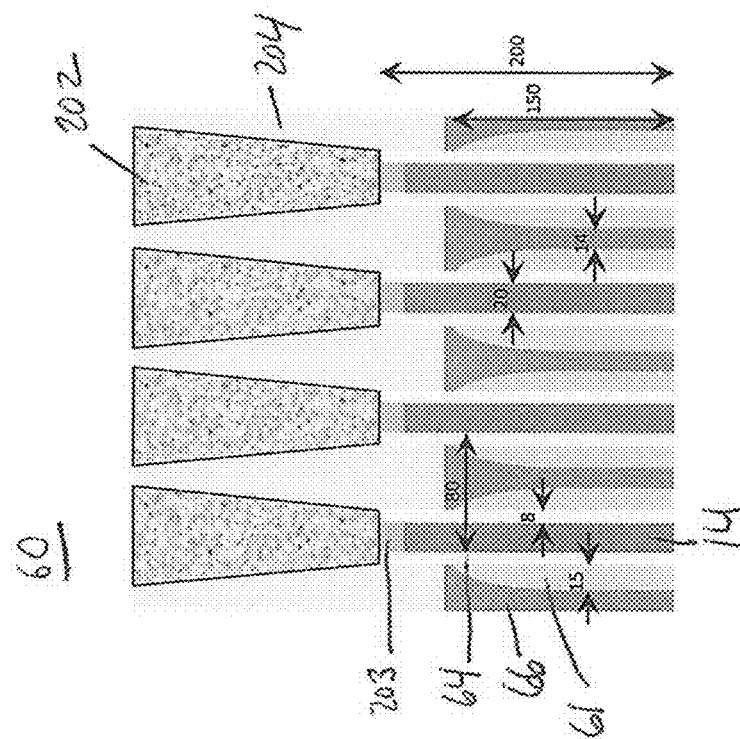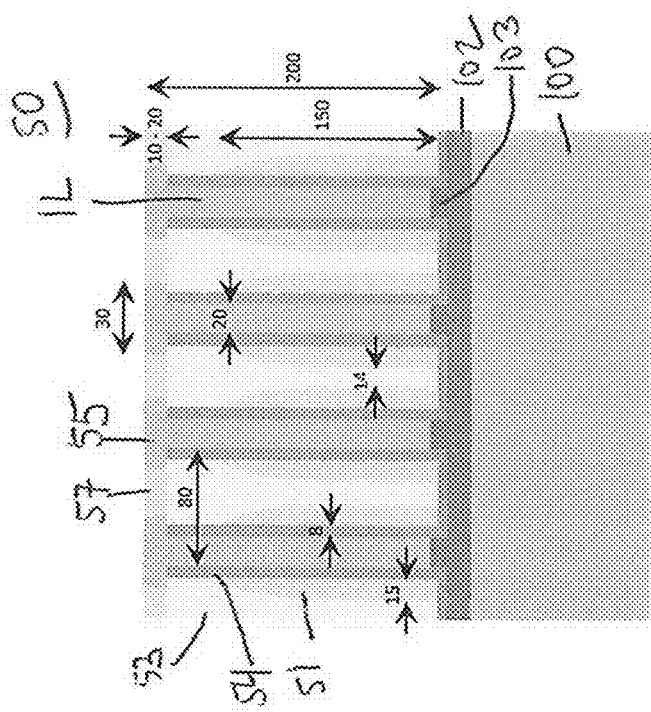
Fig. 12A
Fig. 12B

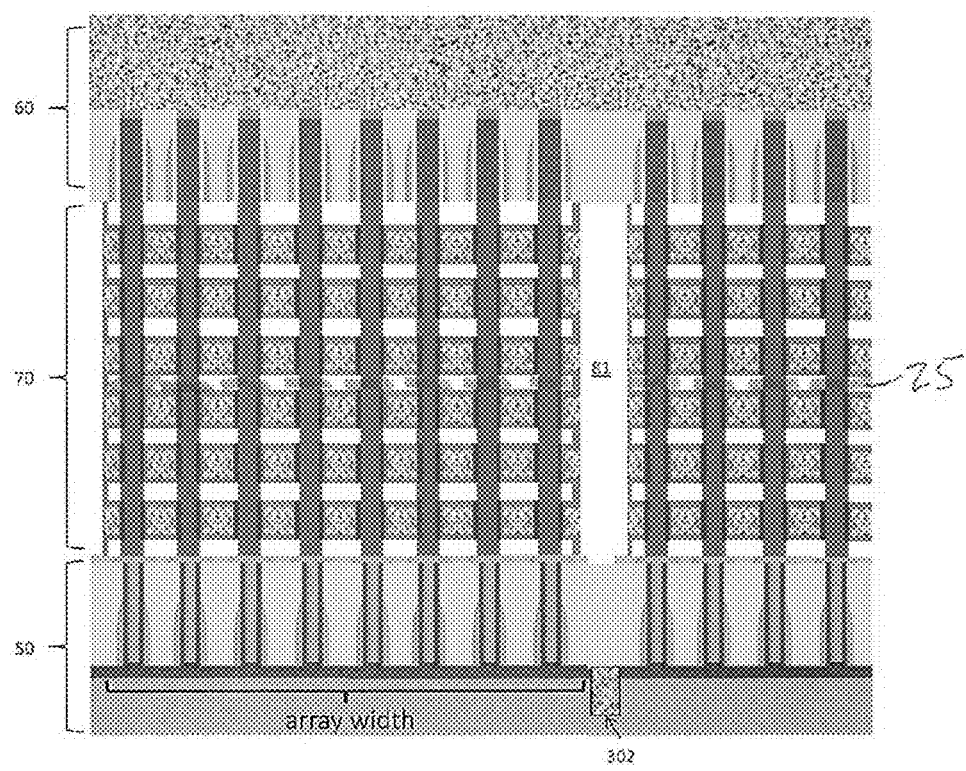

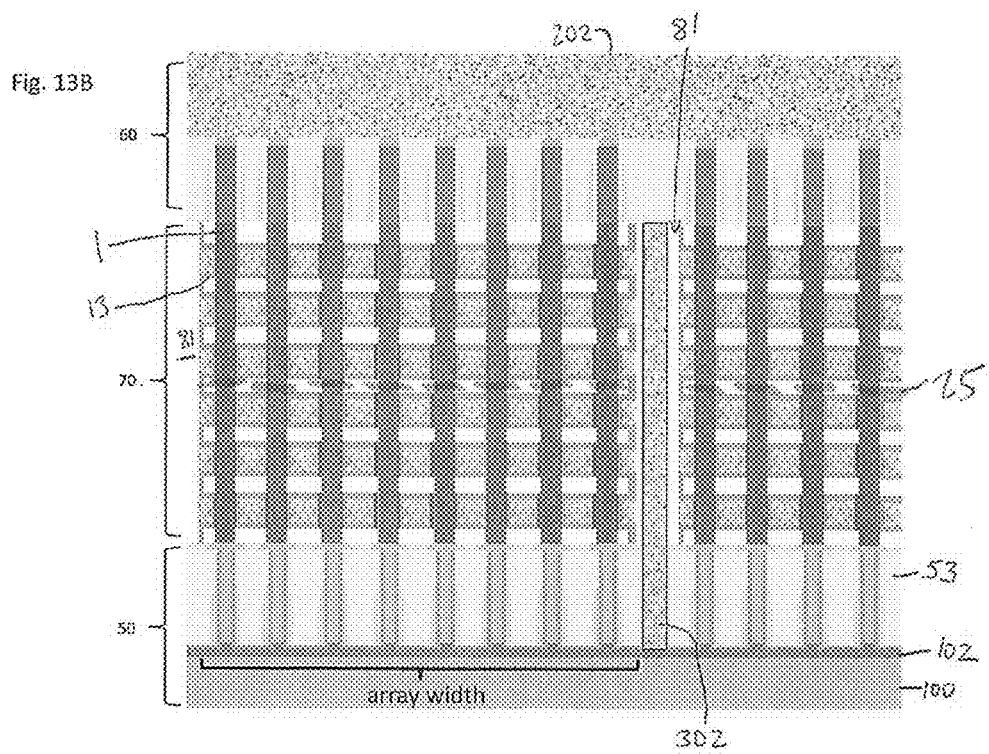

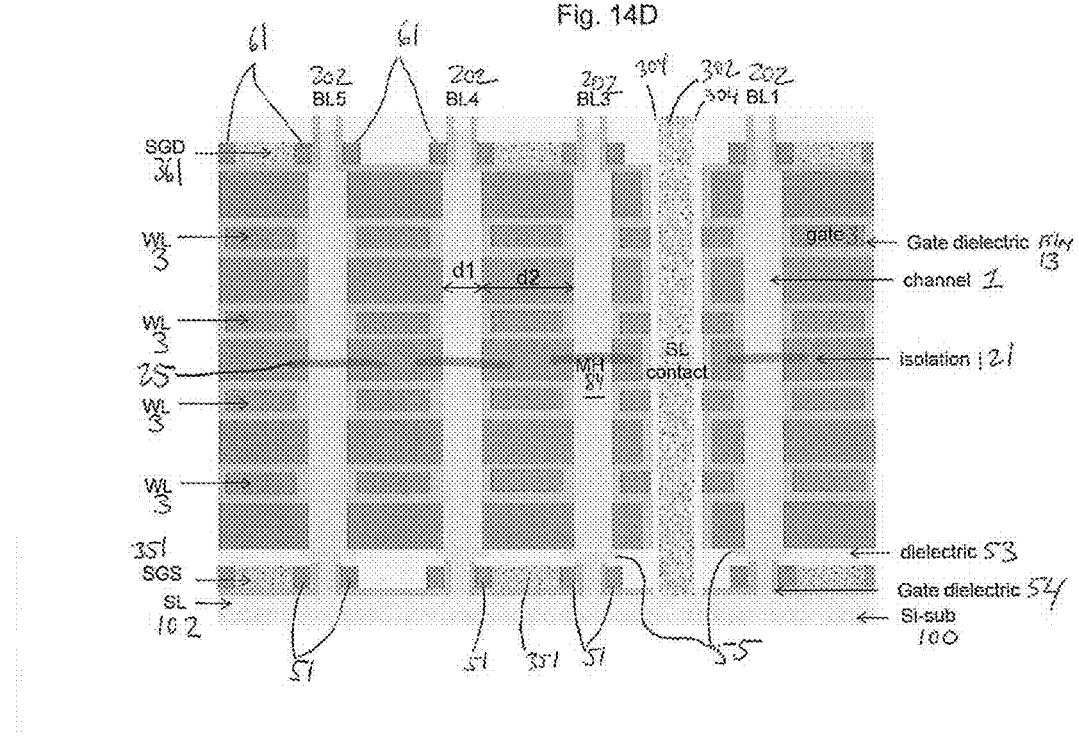

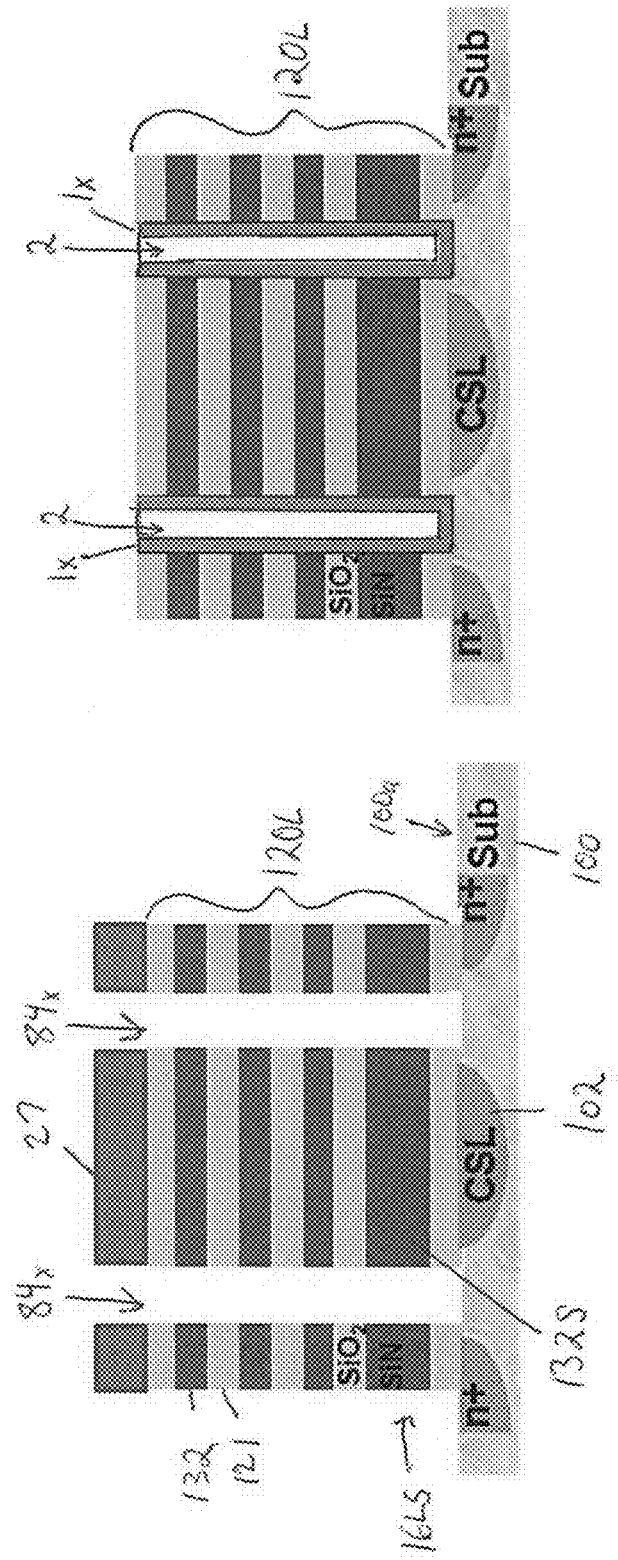

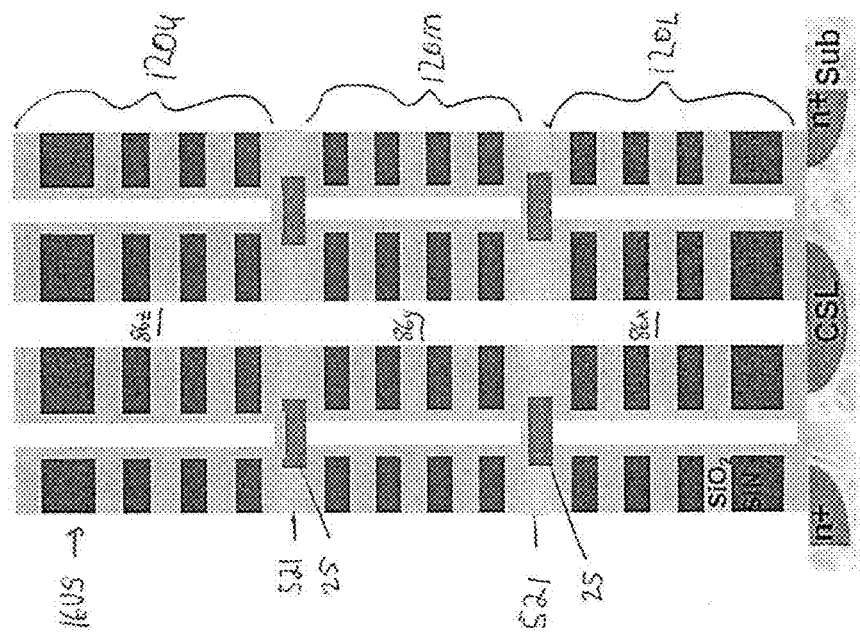
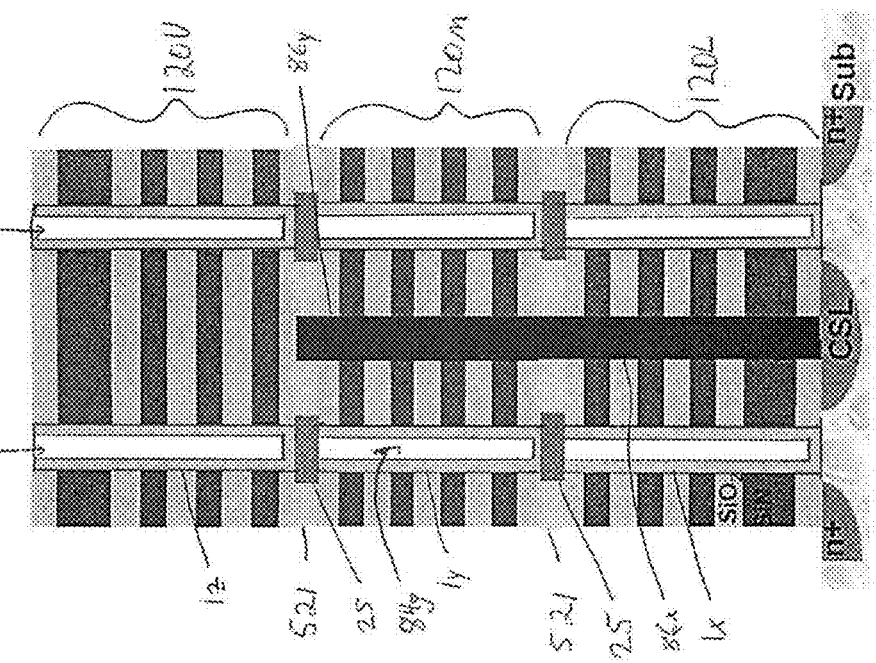

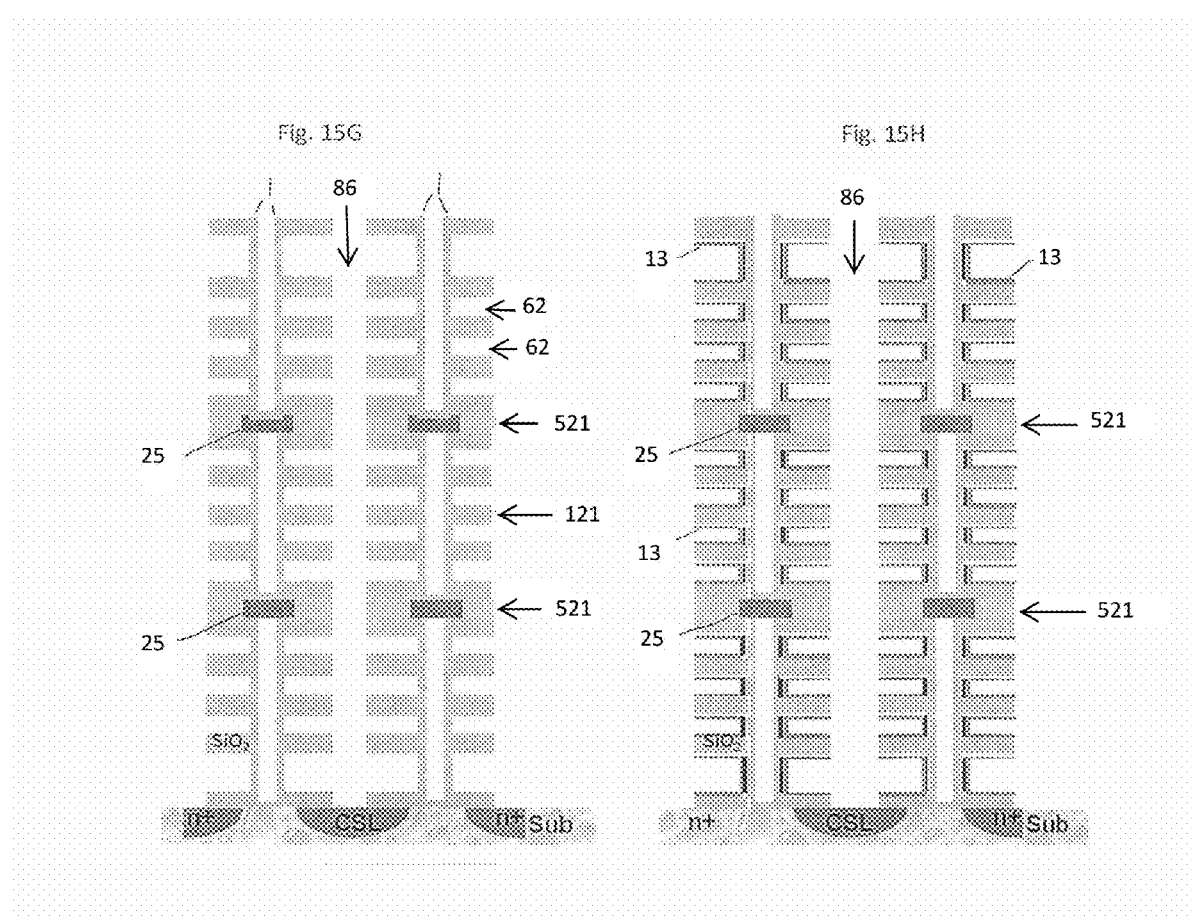

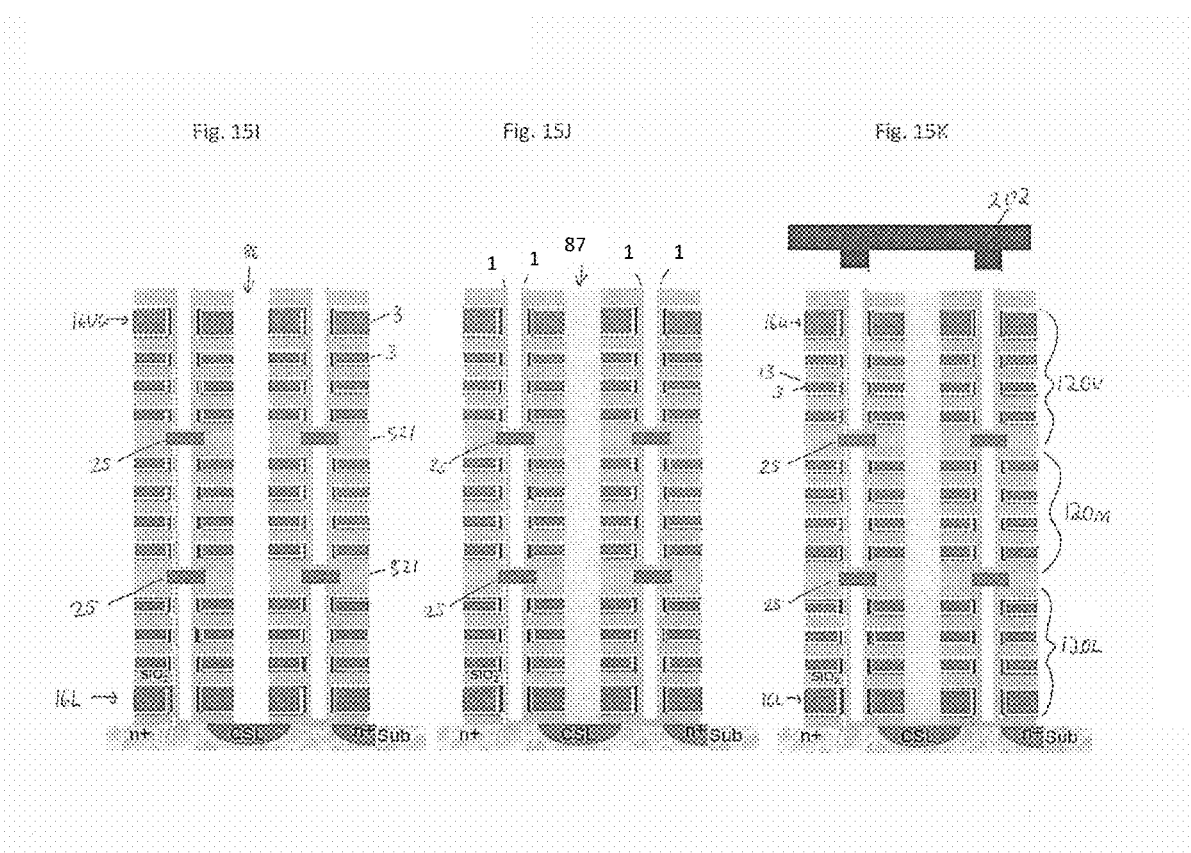

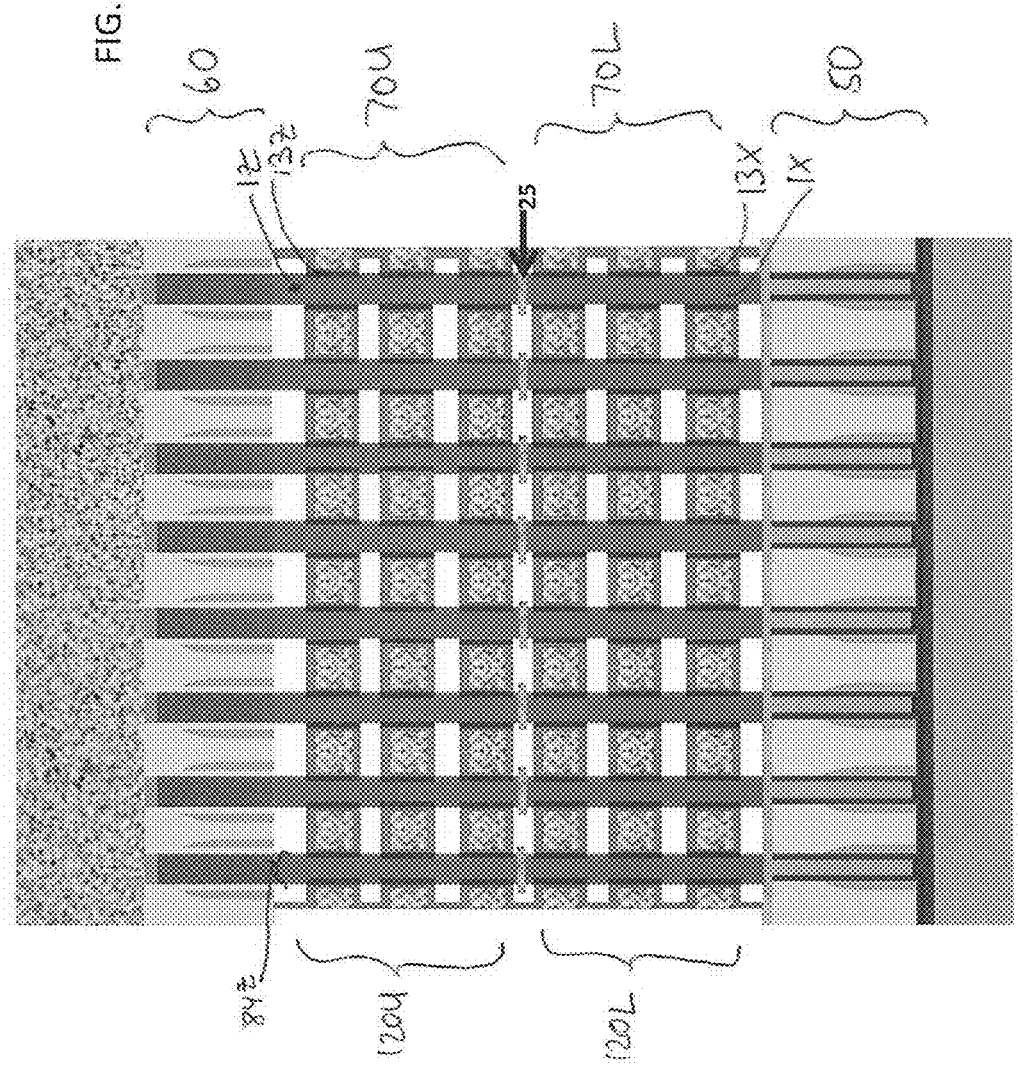

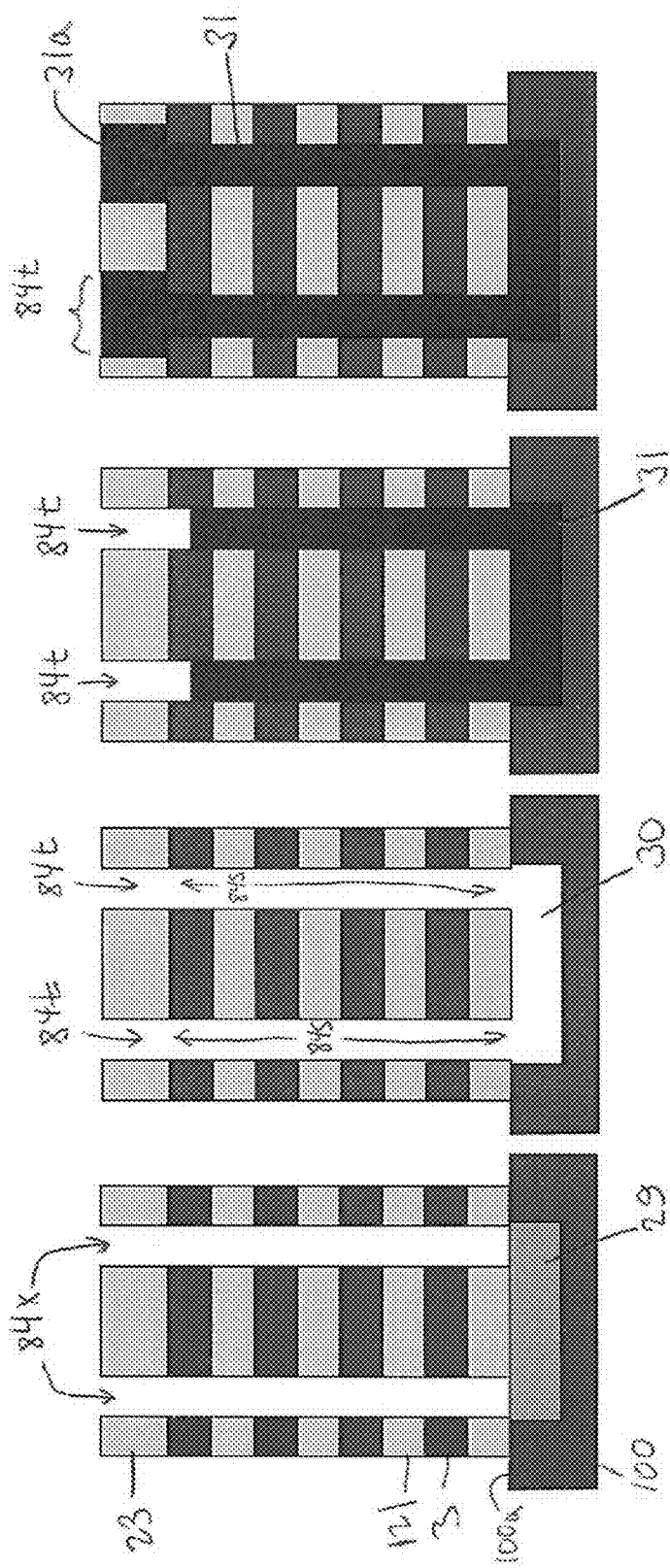

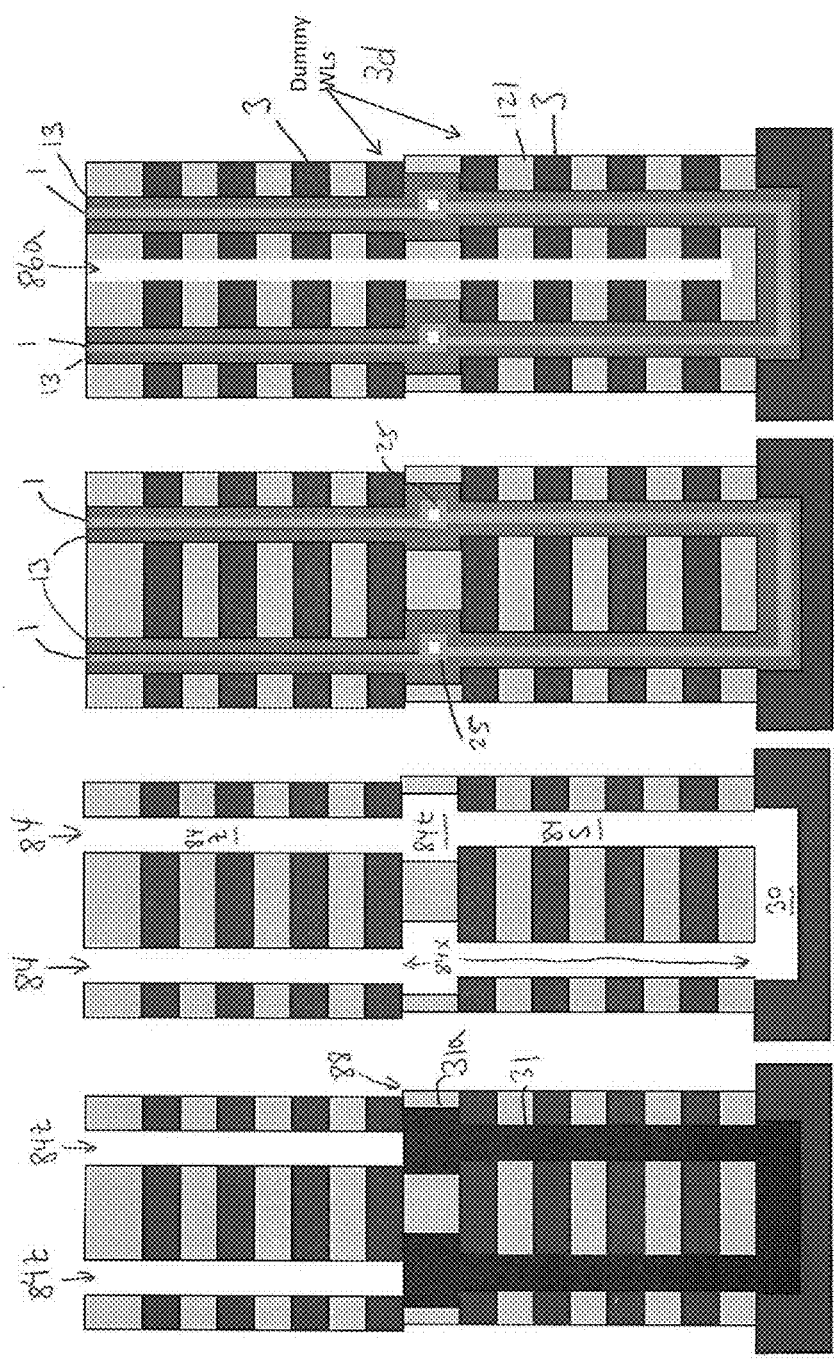

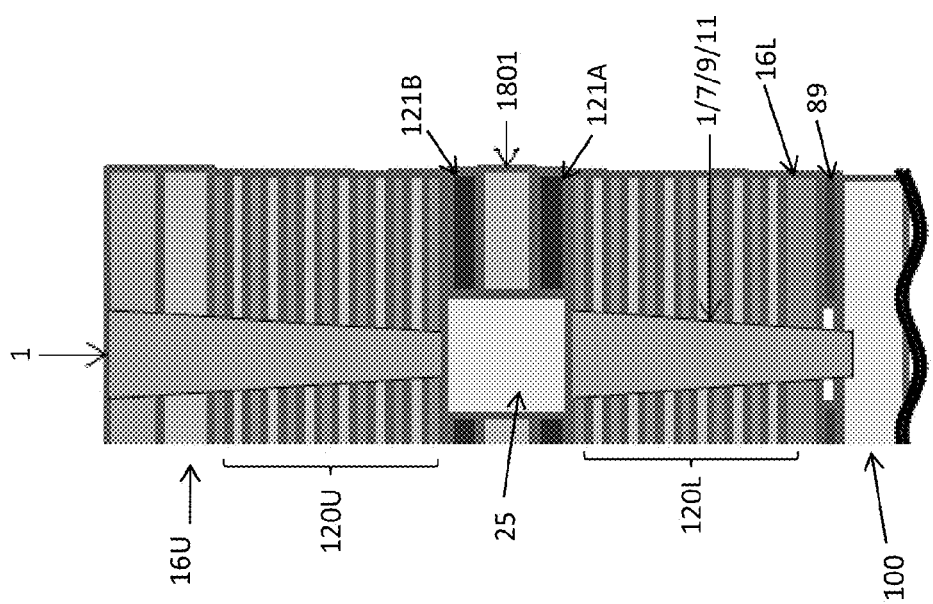

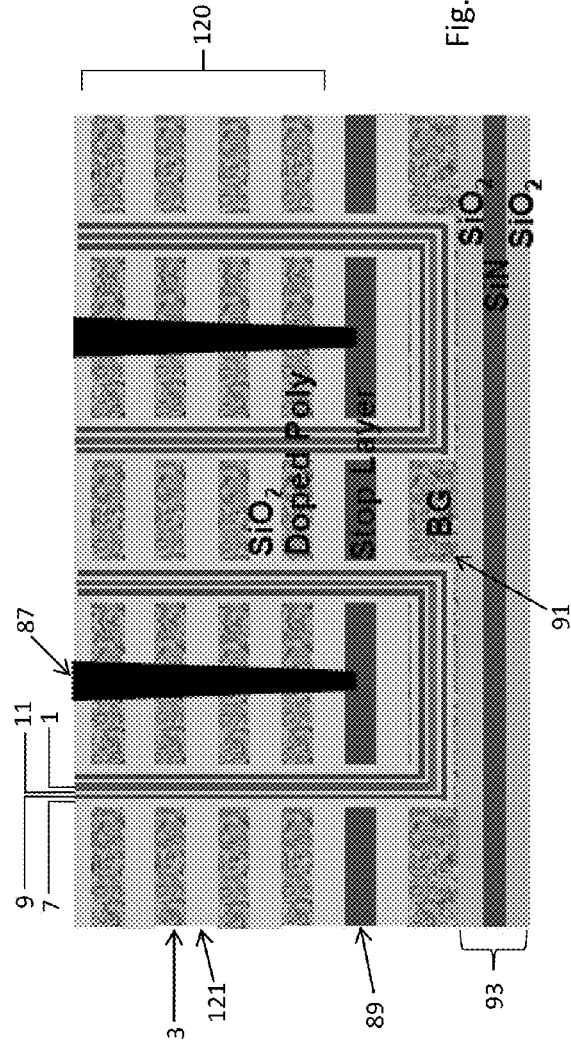
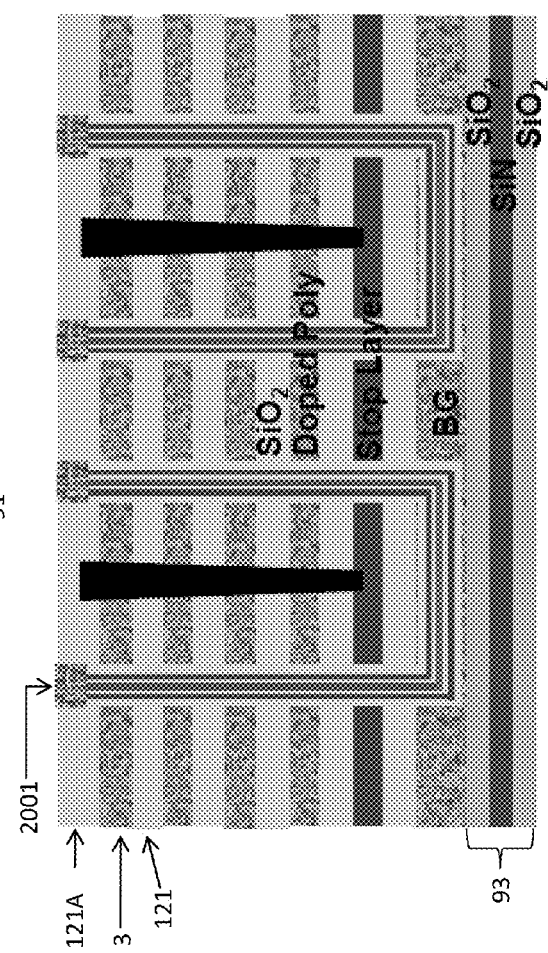

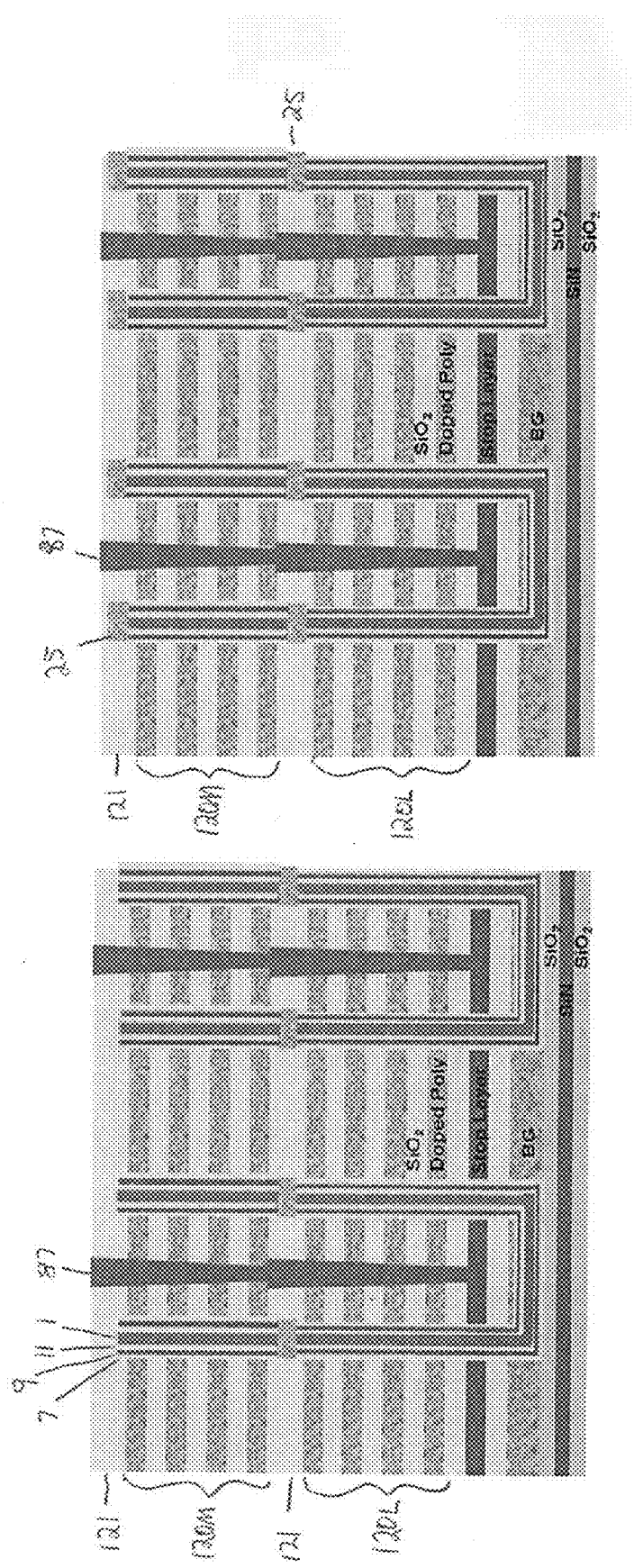

VERTICAL NAND AND METHOD OF MAKING THEREOF USING SEQUENTIAL STACK ETCHING AND LANDING PAD

FIELD

The present invention relates generally to the field of semiconductor devices and specifically to three dimensional vertical NAND strings and other three dimensional devices and methods of making thereof.

BACKGROUND

Examples of prior art three dimensional vertical NAND strings are illustrated in FIGS. 1A and 1B. The device shown in FIG. 1A is known in the art as terabit cell array transistor ("TCAT") array. It includes damascened metal gate SONOS type cells in the vertical NAND flash string formed by a gate replacement process (see Jang, et al., "Vertical cell array using TCAT (Terabit Cell Array Transistor) technology for ultra high density NAND flash memory," 2009 Symposium on VLSI Technology Digest of Technical Papers, pages 192-193, Jun. 16, 2009, Honolulu, Hi., incorporated herein by reference in its entirety).

The device shown in FIG. 1B is known in the art as Pipe-shaped Bit Cost Scalable ("P-BiCS") flash memory (see Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pages 136-137, Jun. 16, 2009, Honolulu, Hi., incorporated herein by reference in its entirety).

SUMMARY

One embodiment includes a vertical NAND string device including a semiconductor channel, wherein at least one end portion of the semiconductor channel extends substantially perpendicular to a major surface of a substrate, at least one semiconductor or electrically conductive landing pad embedded in the semiconductor channel, a tunnel dielectric located adjacent to the semiconductor channel, a charge storage region located adjacent to the tunnel dielectric, a blocking dielectric located adjacent to the charge storage region and a plurality of control gate electrodes extending substantially parallel to the major surface of the substrate. The plurality of control gate electrodes include at least a first control gate electrode located in a first device level and a second control gate electrode located in a second device level located over the major surface of the substrate and below the first device level. The landing pad has a larger width than a widest portion of the channel, tunnel dielectric, charge storage region and blocking dielectric.

Another embodiment includes a method of making a vertical NAND device including forming a lower portion of the memory stack over a substrate, forming a lower portion of memory openings in the lower portion of the memory stack, forming at least one additional portion of the memory stack over the lower portion of the memory stack, forming at least one additional portion of the memory openings in the at least one additional portion of the memory stack, forming a lower portion of the semiconductor channels in the lower portion of the memory openings, forming semiconductor or electrically conductive landing pads in contact with the lower semiconductor channel portions, wherein the landing pads have a larger width than a widest portion of the memory openings and forming at least one additional portion of the semiconductor channels in the at least one additional portion of the memory openings, such that the at least one additional portion of the semiconductor channels contacts the respective landing pads.

Another embodiment includes a method of making a vertical NAND device including forming a lower portion of the memory stack over a substrate, forming a lower portion of memory openings in the lower portion of the memory stack, forming at least one additional portion of the memory stack over the lower portion of the memory stack, forming at least one additional portion of the memory openings in the at least one additional portion of the memory stack, forming a lower portion of the semiconductor channels in the lower portion of the memory openings, forming semiconductor or electrically conductive landing pads in contact with the lower semiconductor channel portions, forming at least one additional portion of the semiconductor channels in the at least one additional portion of the memory openings, such that the at least one additional portion of the semiconductor channels contacts the respective landing pads, filling lower parts of the lower portion of the memory openings with a sacrificial material, widening remaining exposed top parts of the lower portion of the memory openings where the landing pads will be subsequently formed and filling the widened top parts of the lower portion of the memory openings with a sacrificial material.

Another embodiment includes a vertical NAND string device including a mixed metal oxide semiconductor channel, wherein at least one end portion of the semiconductor channel extends substantially perpendicular to a major surface of a substrate, a tunnel dielectric located adjacent to the semiconductor channel, a charge storage region located adjacent to the tunnel dielectric, a blocking dielectric located adjacent to the charge storage region and a plurality of control gate electrodes extending substantially parallel to the major surface of the substrate, wherein the plurality of control gate electrodes include at least a first control gate electrode located in a first device level and a second control gate electrode located in a second device level located over the major surface of the substrate and below the first device level.

Another embodiment includes a vertical NAND string device, including a semiconductor channel, wherein at least one end portion of the semiconductor channel extends substantially perpendicular to a major surface of a substrate, at least one semiconductor or electrically conductive landing pad embedded in the semiconductor channel. The vertical NAND string device also includes a tunnel dielectric located adjacent to the semiconductor channel, a charge storage region located adjacent to the tunnel dielectric, a blocking dielectric located adjacent to the charge storage region and a stack comprising a plurality of control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The at least one landing pad is located between a select gate electrode and an end control gate electrode in the stack.

Another embodiment includes a vertical NAND string device, including a semiconductor channel, wherein at least one end portion of the semiconductor channel extends substantially perpendicular to a major surface of a substrate, at least one semiconductor or electrically conductive current boosting layer electrically connected to the semiconductor channel and to a current or voltage source, a tunnel dielectric located adjacent to the semiconductor channel, a charge storage region located adjacent to the tunnel dielectric, a blocking dielectric located adjacent to the charge storage region and a plurality of control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level.

Another embodiment includes a method of operating a vertical NAND string device having a semiconductor channel with at least one end portion of the semiconductor channel extending substantially perpendicular to a major surface of a substrate, including applying a voltage or current to at least one semiconductor or electrically conductive current boosting layer electrically connected to the semiconductor channel.

BRIEF DESCRIPTION OF THE DRAWINGS

FIGS. 2A, 2B, 3A and 3B are side cross sectional views of a NAND memory device of embodiments of the invention. FIG. 3C is a top cross sectional view of the device of FIGS. 3A and 3B. FIG. 2C is a top cross sectional view of NAND memory devices of FIGS. 2A and 2B. FIGS. 2D and 2E are schematic circuit diagrams of the devices of FIGS. 2A and 2B, respectively.

FIG. 4A is a side cross sectional views of a NAND memory device of an embodiment of the invention.

FIGS. 5A and 5B are perpendicular side cross sectional views along lines A-A' and B-B' in FIG. 5C of a lower select gate device level of the NAND memory device of an embodiment of the invention. FIG. 5C is a top cross sectional view of the device of FIGS. 5A and 5B.

FIGS. 7, 8, 9 and 10 are side cross sectional views of steps in the method of making the memory device levels of the NAND memory device of an embodiment of the invention.

FIGS. 11A and 11B are perpendicular side cross sectional views along lines A-A' and B-B' in FIG. 11C of an upper select gate device level of the NAND memory device of an embodiment of the invention. FIG. 11C is a top cross sectional view of the device of FIGS. 11A and 11B.

FIGS. 12A and 12B are side cross sectional views of respective lower and upper select gate device level of the NAND memory device of an embodiment of the invention.

FIGS. 13A and 13B are side cross sectional views of NAND memory devices of other embodiments of the invention.

FIGS. 14D and 14E are respective side cross sectional views along lines A-A' and B-B' in FIG. 14C of a NAND memory device of an embodiment of the invention.

FIGS. 15A to 15K are side cross sectional views of steps in the method of making the NAND memory device shown in FIG. 2A.

FIGS. 16A to 16B are side cross sectional views of steps in the method of making the NAND memory device shown in FIG. 3A.

FIGS. 17A to 17H are side cross sectional views of steps in a method of overcoming misalignment of memory stacks in making a NAND memory device with at least two memory stacks.

FIG. 18G is a cross sectional view of an alternative NAND memory device with a current boosting layer according to an embodiment.

FIGS. 19A to 19D are side cross sectional views of steps in the method of making the NAND memory device according to another embodiment.

FIGS. 20A to 20J are side cross sectional views of steps in the method of making the NAND memory device shown in FIG. 2B.

DETAILED DESCRIPTION OF THE EMBODIMENTS

Figure 1A:
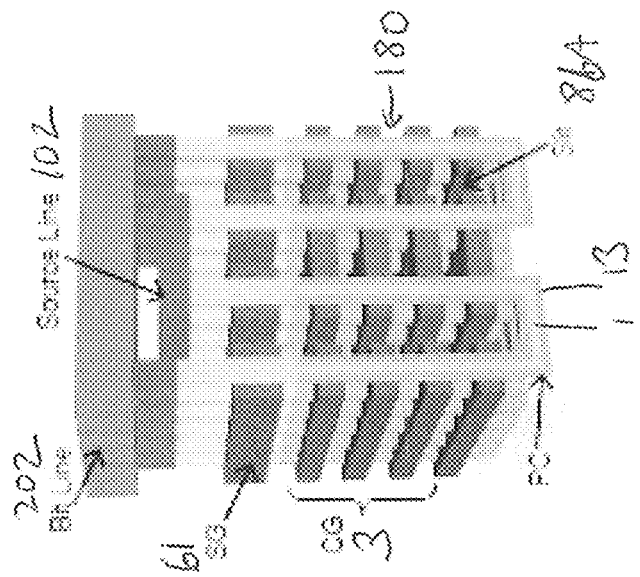
FIG. 1A is a side cross sectional views of a prior art NAND memory device.

Three dimensional (3D) vertical NAND devices (i.e., devices in which at least a part of the channel extends perpendicular to the major substrate surface) requires etching of deep, high aspect ratio memory openings or holes for formation of the vertical channel due to a high number of stacked memory layers surrounding the vertical channels. The terms "memory hole" and "memory opening" are used interchangeably herein. A memory layer includes a control gate and associated charge storage region (e.g., a dielectric isolated floating gate, an ONO stack, etc.) and at least a portion of two dielectric isolation layers located above and below each control gate.

However, the hard mask thickness used during high aspect ratio etching limits of the maximum number of stacked memory layers in the vertical NAND because the amount of hard mask thickness consumed increases during memory opening etching with increasing amount of memory layers stacked in the memory structure. For example, for a 1500 nm thick hard mask, at most 35 memory layers may be etched using reactive ion etching (RIE) to form the memory opening before all of the hard mask thickness is consumed by the etching. Increasing the hard mask thickness to increase the number of stacked memory levels is also not highly desirable because an increase in the hard mask thickness undesirably increases the aspect ratio of the opening.

Furthermore RIE energy also limits the number of stacked memory layers in the vertical NAND. The reactive ions are scattered within the high aspect memory opening during the etching, which leads to a decrease in the RIE energy. For a sufficiently deep, high aspect ratio opening, the RIE energy will eventually be reduced to an extent at which the RIE process loses the capability to etch the memory opening. Therefore, with a smaller RIE energy, a lower number of memory layers can be etched at the same time. However, increasing the RIE energy is also not highly desirable because it leads to increased back sputtering effects which may lead to control gate to control gate (i.e., word line to word line) shorts. Therefore, the RIE energy also limits the number of stacked memory layers in the vertical NAND.

The present inventors realized that the number of stacked memory layers in a vertical NAND may be increased if the portions of each memory openings are etched sequentially.

Due to the limited depth of the opening in sequential etching, the high etching aspect etching ratio challenges noted above may be decreased.

In the sequential memory opening etching method, a lower portion of the memory stack is formed over a substrate. This portion includes only a part of the memory layers that will be used in the vertical NAND. The lower portions of the memory openings are etched in the lower portion of the memory stack. Then, at least one additional portion of the memory stack is formed over the lower portion of the memory stack. The at least one additional portion of the memory stack contains additional memory levels. Then, additional portions of the memory openings are then etched in the at least one additional portion of the memory stack.

If the stack contains two portions, then the at least one additional portion comprises an upper portion of the stack and the additional portions of the memory openings comprise upper portions of the memory openings. If the stack contains more than two portions, then the above process may be repeated several times. In this case, the at least one additional portion comprises one or more middle portions and an upper portion of the stack and the additional portions of the memory openings comprise one or more middle portions and upper portions of the memory openings.

The separate etching of memory opening portions in each portion of the stack may be conducted with separate hard masks. Thus, each hard mask used during each etching step may be relatively thin and the hard mask thickness does not limit the total number of memory layers in the stack. Likewise, because each RIE step of each memory opening portions forms an opening that has a limited depth, the RIE energy also does not limit the total number of memory layers in the stack.

However, because the different portions of the memory openings are etched during different etching steps using different lithography steps and different hard mask layers, it may be difficult to align the different portions of each memory opening (i.e., lower portion, upper portion and optionally one or more middle portions) to form a continuous memory opening through the entire stack due to photolithography misalignment issues, especially if each memory opening has more than two portions (i.e., the stack is etched three or more times to form a memory opening). The misalignment of the memory opening portions may lead to channel discontinuity which results in an open NAND string.

The present inventors realized that the memory opening alignment challenges may be reduced or avoided by adding a landing pad between the memory stack portions. The landing pad is wider (e.g., had a larger diameter) than the channel in the horizontal direction. The landing pad may be 10-100% wider, such as 25-75% wider than the channel (i.e., for disc shaped pads and cylindrical channels, the pad diameter is larger than the channel diameter by 10-100%). For example, for a 25-150 nm, such as a 45-50 nm diameter cylindrical channel, the pad diameter (i.e., width) may be 30-300 nm, such as 55-100 nm. The pad may be 20-50 nm, such as 30-40 nm thick. Thus, the landing pad connects adjacent channel portions in adjacent memory opening portions of the same memory opening even if the memory opening portions are misaligned with respect to each other.

Use of reactive ion etching to form the memory openings may result in memory openings that narrow towards the bottom of the opening. This is especially true when etching deep openings that have a high aspect ratio. As illustrated in the figures and discussed in more detail below, the landing pads contact the upper, widest portion of the memory openings. In an embodiment, the landing pad is wider than the widest portion of the memory openings. In some embodiments, the memory openings include a blocking dielectric, a charge storage region and a tunnel dielectric in addition to the channel. In these embodiments, the landing pad in preferably has a larger width than a widest portion of the channel, tunnel dielectric, charge storage region and blocking dielectric.

The landing pad may comprise any suitable semiconductor or electrical conductor material, such as silicon, metal, metal alloy, etc. Preferably, the landing pad is made of the same semiconductor material as the channel of the vertical NAND. For example, the landing pad may comprise a polysilicon landing pad if the channel is a polysilicon channel. A semiconductor landing pad may be intrinsic or have the same conductivity type (e.g., p or n) as the channel. The semiconductor landing pad may be heavier doped than the channel (e.g., heavily doped landing pad and lightly doped channel), have the same doping concentration as the channel or may be lighter doped than the channel. In other words, the pad resistivity may be less than, greater than or the same as the resistivity of the channel material. Alternatively, the landing pad may comprise a metal (e.g., Ti, W, etc.) or conductive metal alloys (e.g., TiN, WN, a metal silicide, such as titanium, tungsten, nickel, cobalt or platinum silicide, etc.).

The landing pad may be formed over each channel portion (except over the upper most channel portion if desired) during the same deposition step as the channel deposition step or during subsequent deposition step. Then, the next overlying channel portion is formed on the landing pad.

Since the landing pad adds an amount of resistance to the vertical NAND string, the landing pad may also be considered a resistor built into the vertical channel of the vertical NAND string. The impact of the increase in resistance on the vertical NAND read performance due to the presence of the resistor should not be great.

For example, for a heavily doped landing pad/resistor comprising heavily doped polysilicon (e.g., $10^{19}$ cm$^3$ doping concentration) having a thickness is 30 nm, the resistance value is 1.35 kOhm. If the stack includes five landing pads per channel or ten landing pads per U-shaped channel in a P-BiCS vertical NAND, then the total resistance is 13.5 kOhm for a 50 nm diameter memory opening. If a 400 nA read current is used in the NAND string, then the bit line voltage needs to increase by only 5 mV due to the ten additional series resistors/landing pads. Likewise, an additional thermal budget (e.g., MONOS anneal) may be added due to the presence of the landing pads. However, the thermal budget impact on the NAND string characteristics should be manageable.

Vertical NAND devices containing a landing pad/built-in resistor may have any suitable configuration. FIGS. 2A through 4B illustrate various non-limiting, exemplary VNAND devices containing a landing pad/built-in resistor.

Figure 2D:
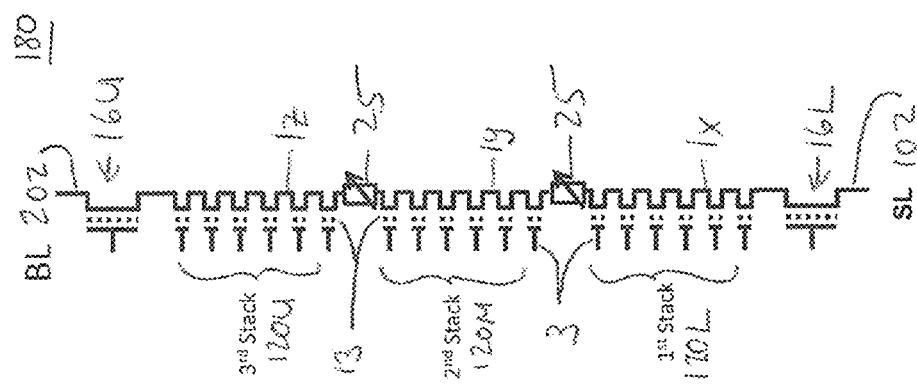
Figure 2A:
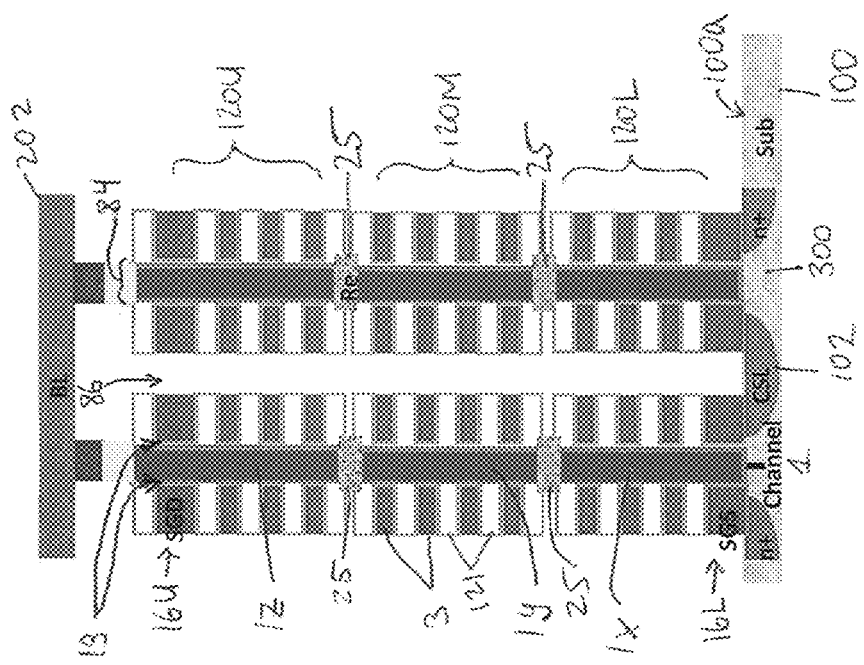

FIGS. 2A and 2D illustrate a vertical NAND containing a landing pad/built-in resistor having a single vertical channel having a pillar type configuration. FIGS. 2B and 2E illustrate a vertical NAND containing a landing pad/built-in resistor having a U-shaped (e.g., pipe shaped) channel having a "P-BiCS" type configuration. FIG. 2C illustrates a top view of the devices in FIGS. 2A and 2B. FIGS. 3A through 4B illustrate a vertical NAND containing a landing pad/built-in resistor having a compact vertical NAND ("CVNAND") type configuration, which will be described in more detail below. The CVNAND device is also described in more detail in U.S. patent application Ser. No. 13/754,293, filed on Jan. 30, 2013 and incorporated herein by reference in its entirety.

In an embodiment, the NAND string 180 illustrated in FIGS. 2A-4B may be formed with a vertical channel. In one aspect, the vertical channel 1 has a solid, rod shape as shown in FIGS. 2A, 2B, 3B, 3A and 4B. In this aspect, the entire channel comprises a semiconductor material. In another aspect, the vertical channel has a hollow cylinder shape as shown in FIG. 4A. In this aspect, the vertical channel includes a non-semiconductor core 2 surrounded by a semiconductor channel 1 shell. The core may be unfilled or filled with an insulating material, such as silicon oxide or silicon nitride.

In some embodiments, the monolithic three dimensional NAND string 180 comprises a semiconductor channel 1 having at least one end portion extending substantially perpendicular to a major surface 100a of a substrate 100, as shown in FIGS. 2A, 2D, 3A and 3B. For example, the semiconductor channel 1 may have a pillar shape and the entire pillar-shaped semiconductor channel extends substantially perpendicularly to the major surface 100a of the substrate 100. In these embodiments, the source/drain electrodes of the device can include a lower electrode 102 (e.g., a heavily doped semiconductor region source electrode in the major surface 100a of a semiconductor substrate 100) provided below the semiconductor channel 1 (optionally in contact with a doped source region 103), and an upper electrode 202 (e.g., bit line) formed over the doped drain region 203 in the semiconductor channel 1, as shown in FIG. 2A. The lower electrode 102 contacts a metal interconnect outside of the view shown in FIGS. 2A and 3A or contacts metal wires of circuitry under the array. Thus, the drain/bit line electrode 202 contacts the pillar-shaped semiconductor channel 1 (via the drain region 203) from above, and the source electrode 102 contacts the pillar-shaped semiconductor channel 1 from below (e.g., via source region 103). For example, the device shown in FIGS. 2A and 2D contains two levels of landing pads 25, which divide the channel and the stack into three portions: lower portion of the stack 120L containing the lower portions 1xa, 1xb of the wings 1a, 1b; middle portion of the stack 120M containing the middle portions 1ya, 1yb of the wings 1a, 1b; and upper portion of the stack 120U containing the upper portions 1za, 1zb of the wings 1a, 1b.

Alternatively, as shown in FIG. 2B, the NAND string may have a U shape (also known as a "pipe" shape) with two vertical channel wing portions connected with a horizontal channel connecting the wing portions. In one aspect, the U shaped or pipe shaped channel may be solid, as in the solid rod shaped vertical channel NAND as shown in FIG. 2B. In another aspect, the U shaped or pipe shaped channel may be hollow cylinder shaped, (similar to the hollow cylinder pipe shaped vertical channel NAND as shown in FIG. 4A). The U-shaped pipe channel may be filled or unfilled. Separate front side and back side methods for fabricating both single vertical channel and U shaped channel NAND strings are taught in U.S. Pat. No. 8,187,936, hereby incorporated by reference in its entirety for teaching of the separate front and back side processing methods.

The two wing portions 1a and 1b of the U-shape semiconductor channel may extend substantially perpendicular to the major surface of the substrate, and a connecting portion 1c of the U-shape semiconductor channel 1 connects the two wing portions 1a, 1b extends substantially perpendicular to the major surface of the substrate. The wing portions 1a, 1b of the channel 1 contain the built-in landing pads/resistors 25. For example, the device shown in FIGS. 2B and 2E contains two levels of landing pads 25, which divide the channel and the stack into three portions: lower portion of the stack 120L containing the lower portions 1xa, 1xb of the wings 1a, 1b; middle portion of the stack 120M containing the middle portions 1ya, 1yb of the wings 1a, 1b; and upper portion of the stack 120U containing the upper portions 1za, 1zb of the wings 1a, 1b.

In these embodiments, one of the source or drain electrodes 202 (e.g., bit line) contacts the first wing portion of the semiconductor channel from above, and another one of a source or drain electrodes (e.g., source line) 102 contacts the second wing portion of the semiconductor channel 1 from above. An optional body contact electrode 91 may be disposed over or in the substrate to provide body contact to the connecting portion of the semiconductor channel 1 from below. The NAND string's select or access transistors 16 are shown in FIGS. 2B and 2E. These transistors and their operation are described in U.S. Pat. No. 8,187,936, which is incorporated by reference for a teaching of the select transistors. The device of FIGS. 2B and 2E is described in more detail below with reference to the method of making the P-BiCS type vertical NAND, as shown in FIGS. 17A-17H.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, indium antimonide, or other compound semiconductor materials, such as III-V or II-VI semiconductor materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 in FIG. 4A may comprise any electrically insulating material, such as silicon oxide, silicon nitride, silicon oxynitride, or other insulating materials.

Each monolithic three dimensional NAND string 180 further comprises a plurality of control gate electrodes 3, as shown in FIGS. 2A, 2B, 3A, 3B and 4A-4B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A, as shown in FIGS. 2A, 2B, 3A and 4A. The control gate material may comprise any one or more suitable conductive or semiconductor control gate material known in the art, such as doped polysilicon or a metal, such as tungsten, copper, aluminum, tantalum, titanium, cobalt, titanium nitride or alloys thereof.

Each channel 1 shown in FIGS. 2A-4B contains one or more landing pads/built-in resistors 25 described above. Preferably, each landing pad 25 is located in a vertical position of the channel between control gates 3 (i.e., having one control gate above and one control gate below). Thus, the landing pad is located between the first device level (e.g., level A) and the second device level (e.g., level B). A lower portion of the semiconductor channel (e.g., 84x) located in the first device level contacts a bottom surface of the landing pad 25. A middle or upper portion (e.g., 84y) of the semiconductor channel located in the second device level contacts a top surface of the same landing pad 25.

The landing pad 25 may extend horizontally beyond the memory hole 84 diameter or width to be located over and under adjacent control gates 3 inside the dielectric fill material 121 Thus, the landing pad 25 may extend into the insulating layer 121 between the first 3a and the second 3b control gate electrodes 3. The fill material 121 isolates the landing pad 25 from direct contact with the control gate electrodes 3. Alternatively, the landing pad 25 may be relatively thick and contact dummy control gate electrodes 3d, as shown in FIGS. 17G and 17H. Dummy control gate electrodes 3d (i.e., dummy word lines) are not connected to outside control circuitry and are not provided with a current or voltage during NAND operation.

Figure 3A:
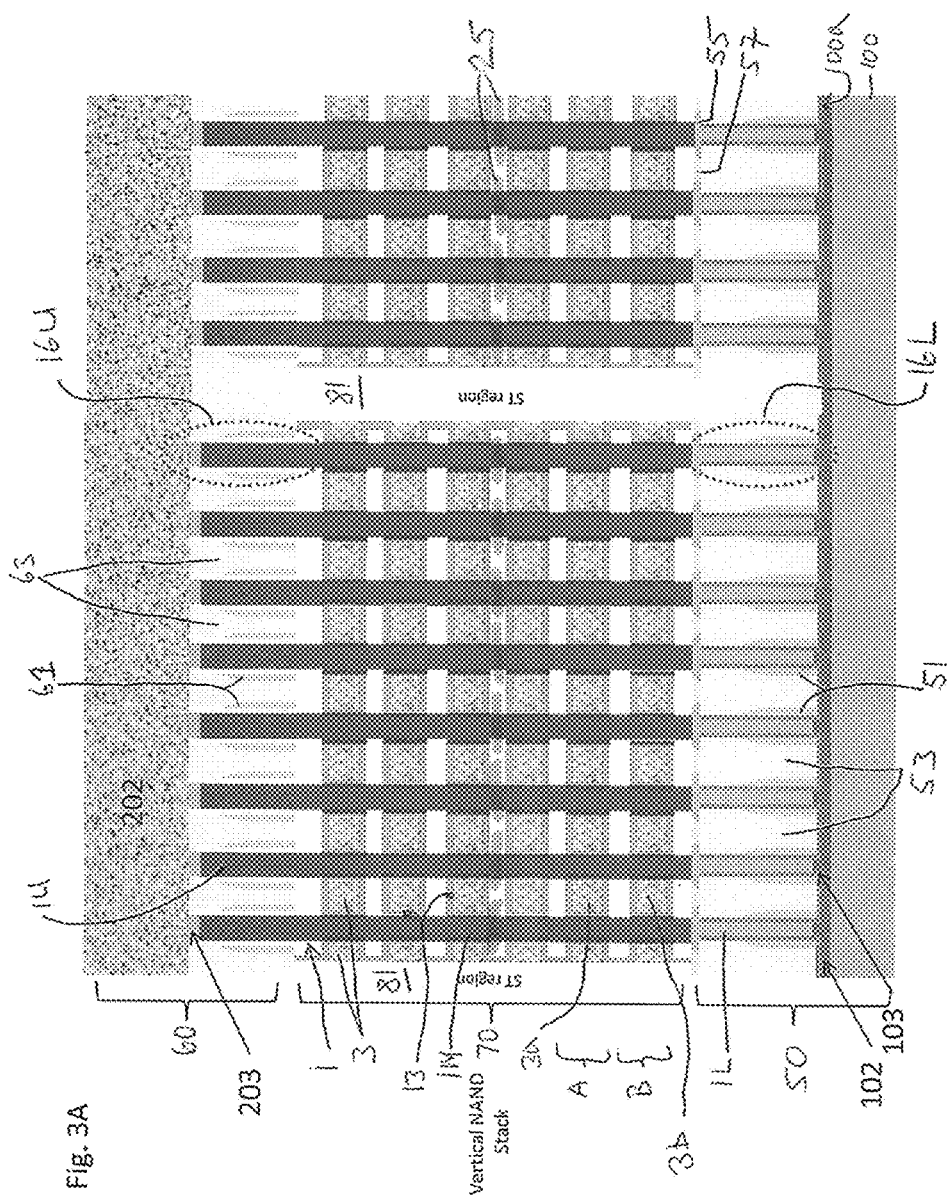

A blocking dielectric 7 is located adjacent to and may be surrounded by the control gate(s) 3. The blocking dielectric 7 may comprise a continuous layer or a plurality of blocking dielectric segments located in contact with a respective one of the plurality of control gate electrodes 3. For example, a first dielectric segment 7a located in device level A and a second dielectric segment 7b located in device level B are in contact with control electrodes 3a and 3b, respectively, as shown in FIG. 4A. In some embodiments, at least a portion of each of the plurality of blocking dielectric segments 7 surrounds the top, bottom, and two edge portions of a control gate electrode 3 between two adjacent NAND strings, as shown in FIGS. 3A and 4A.

The NAND devices also comprise one or more charge storage regions 9 located between the channel 1 and the blocking dielectric 7. The charge storage regions 9 may comprise a continuous vertical charge storage layer adjacent to plural control gate electrodes 3, as shown in FIGS. 2A and 2B or the plurality of discrete charge storage regions 9 comprise at least a first discrete charge storage segment 9a located in the device level A and a second discrete charge storage segment 9b located in the device level B, as shown in FIG. 4A.

A tunnel dielectric 11 is located between the charge storage region(s) 9 and the semiconductor channel 1. The blocking dielectric 7 and the tunnel dielectric 11 may be independently selected from any one or more same or different electrically insulating materials, such as silicon oxide, silicon nitride, silicon oxynitride, or other insulating materials.

The charge storage region(s) 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate(s), conductive nanoparticles, or a charge storage dielectric layer or segment (e.g., silicon nitride or another dielectric). For example, in some embodiments, the charge storage regions comprise silicon nitride, where the silicon oxide blocking dielectric 7, the nitride charge storage region 9 and the silicon oxide tunnel dielectric 11 form oxide-nitride-oxide (ONO) memory film 13 of the NAND string shown in FIGS. 2A, 2B, 3A and 4A. Alternatively, the blocking dielectric may comprises a tri-layer ONO dielectric, such that the memory film 13 comprises ONO (11)-N (9)-O (7).

Figure 4B:
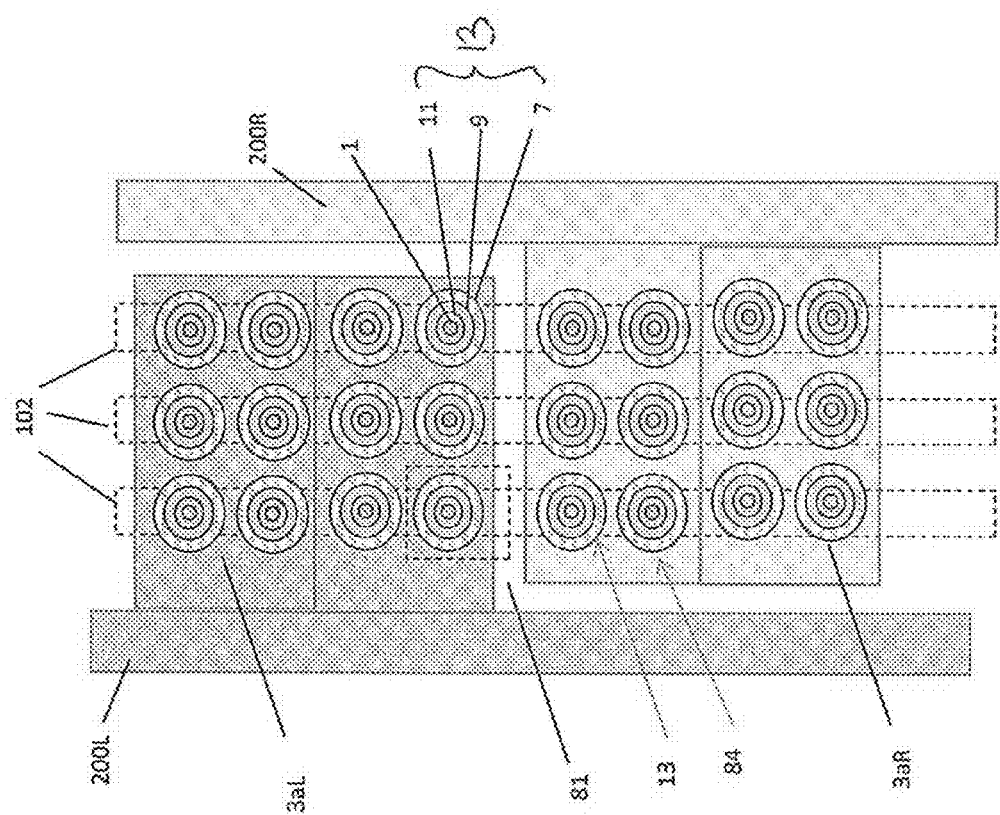
FIG. 4B is a top cross sectional view of the device of FIG. 4A.

As shown in FIG. 4B, the tunnel dielectric 11 comprises a cylinder which surrounds the semiconductor channel 1, the charge storage region 9 comprises a cylinder which surrounds the tunnel dielectric, and the blocking dielectric 7 comprises a cylinder which surrounds the charge storage region. The first 3a and the second 3b control gate electrodes 3 surround the blocking dielectric in each NAND string.

The CVNAND configuration shown in FIGS. 3A-4B provides a denser memory design than the configurations shown in FIGS. 2A and 2B, respectively, for the following reasons. For example, as shown in FIG. 2A, each pillar NAND string 180 is separated from adjacent strings by a word line cut or trench 86. The bottom source select gate (SGS) device 16L in FIG. 2A requires a cut space or trench 86 between the lower select gate electrodes which are built from the bottom of the stack metal layer. Furthermore, the source line 102 formation process and p-well 300 contact requires additional space in the device of FIG. 2A.

Likewise, as shown in FIGS. 2B and 2E, each U-shaped P-BiCS NAND string 180 contains a dielectric 87 filled slit trench 86A between the select and control gates 3 and the wings or arms of the U-shaped channel 1 which extends between upper source line 102 and bit line 202. Furthermore, as shown in FIG. 2B, adjacent U-shaped NAND strings 180 are also separated by a word line cut or trench 86B not to lose active holes and to reduce word line R. The top view of the filled memory holes 84 (i.e., containing the NAND string channels 1 and a film 13 comprising tunnel dielectric, charge storage region and blocking dielectric) and the trenches 86 in vertical pillar and P-BiCS type devices is illustrated in FIG. 2C. The control gates are omitted from FIG. 2C for clarity and the supporting columns 88 which prevent the device levels from collapsing on each other during removal of sacrificial material are shown in the bottom of the figure. The trenches result in a higher than desired pitch between adjacent filled memory holes (e.g., a pitch of about 150 nm) and reduces the array efficiency by more than 50%.

The word line (i.e., control gate) trenches or cuts 86 in an array of vertical NAND strings may be eliminated to increase the device density and reduce the filled memory hole 84 pitch. Embodiments include monolithic three dimensional NAND strings and methods of making three dimensional NAND devices (e.g., CVNAND devices) having at least one 3×3 array of vertical NAND strings in which the control gate electrodes are continuous in the array and do not have an air gap or a dielectric filled trench 86 in the array. The NAND device is formed by first forming a lower select gate level having separated lower select gates, then forming plural memory device levels containing a plurality of NAND string portions, and then forming an upper select gate level over the memory device levels having separated upper select gates.

Embodiments of the compact vertical NAND (i.e., CVNAND) device are shown in FIGS. 3A, 3B, 3C, 4A and 4B. FIG. 3A schematically illustrates a side cross sectional view of the entire CVNAND device, including the lower 50 and upper 60 select gate device levels located below and above the memory device levels 70 shown in FIG. 4A. FIG. 3B schematically illustrates a side cross sectional view of the memory levels 70 and select gate device levels 50, 60 of one CVNAND array and FIG. 3C schematically illustrates the top view location of the filled memory holes 84 and supporting pillars 88. FIG. 4A illustrates a side cross sectional view of the memory device levels 70 (i.e., levels containing the control gate electrodes/word lines) in one NAND string array. FIG. 4B schematically illustrates the top cross sectional view of the relationship between the continuous control gate electrodes 3 and the filled memory holes 84 in each array block.

As shown in FIGS. 3A, 4A and 4B the first control gate electrode 3a and the second control gate electrode 3b are continuous in the array, such that these electrodes do not have an air gap or a dielectric filled trench in the array. As shown in FIG. 4B, the control gate electrodes 3 when viewed from the top comprise a "mesh" which is continuous except for the memory holes 84 which are completed filled with the channel 1, an optionally the tunnel dielectric 11, charge storage region 9, blocking dielectric 7 and optional insulating fill 2. In other words, the control gate electrodes 3 may be considered to be a mesh in which all openings are filled FIG. 4B shows two control gate electrodes 3aL and 3aR (i.e., left and right electrodes) located in the first device level A. Each electrode forms a continuous mesh around an exemplary 4×3 array of filled memory holes 84. Each electrode 3aL and 3aR contacts a respective word line 200L and 200R of an array block. An array block includes plural arrays (e.g., plural 4×3 arrays) which are connected by their respective control gate electrodes (e.g., 3aL) to a common word line (e.g., 200L). Only one array is shown as being connected to each word line via a respective control gate electrode in FIG. 4B for clarity. However, it should be understood that the pattern shown in FIG. 4B repeats along the word lines. Thus, each array is located in a respective array block, where the left control gate electrode 3aL in one block in device level A is separated from the right control gate electrode 3aR in the same level A in an adjacent array block by an air gap (if the slit trench 81 is not filled) or a dielectric filled trench 81. The same configuration is used in the other memory levels shown in FIGS. 4A and 3A.

The CVNAND string's select or access transistors 16L, 16U are shown in FIGS. 3A, 3B, 5, 6 and 11. As shown in FIGS. 3A and 5A-5C, a lower select gate electrode 51 is located adjacent to a lower portion 1L of the pillar-shaped semiconductor channel 1 below the control gate electrodes 3 (e.g., 3a, 3b) in the lower select gate electrode level 50. Level 50 may be a source select gate level and electrode 51 may be a source side select gate electrode. Each lower select gate electrode 51 is separated from adjacent lower select gate electrodes 51 in the array in level 50 by an air gap or a dielectric filled trench 53.

Furthermore, as shown in FIGS. 3A and 11A-C, an upper select gate electrode 61 is located adjacent to an upper portion 1U of the pillar-shaped semiconductor channel 1 above the first 3a and the second 3b control gate electrodes. Electrode 61 may comprise a drain side select gate electrode located in the drain upper select gate level 60. Each upper select gate electrode 61 is separated from adjacent upper select gate electrodes 61 in the array in level 60 by an air gap or a dielectric filled trench 63.

In one non-limiting embodiment, each semiconductor channel 1 comprises a first portion 1U adjacent to the upper select gate electrode 61, a second portion 1L adjacent to the lower select gate electrode 51, a third (i.e., middle or memory) portion 1M located at least in the first (A) and the second (B) device levels between the first and the second portions, and an optional, additional landing pad portion 55 located between the second 1L and the third 1M channel 1 portions.

In one embodiment shown in FIG. 3B, the third (middle) portion 1M of the channel 1 has a larger diameter or width than the first (upper) 1U and the second (lower) 1L channel 1 portions because these three portions are formed in separate process steps as described below. The thinner upper 1U and lower 1L channel 1 portions allow the space for the air gap or a dielectric filled trench 53, 63 to be added between adjacent upper 61 and lower 51 select gates in respective levels 60 and 50. In contrast, since the control gates 3 are continuous and do not require air gap or trench adjacent to the middle (memory) portions 1M of the channel 1, the channel portions 1M may be thicker than channel portions 1U and 1L.

Finally, as shown in FIGS. 3A, 3B, 5 and 6 and as will be explained in more detail below, the channel 1 may optionally contain additional landing pad portions 55 between the lower select gate level 50 and the memory levels 70 and between the memory level 70 and the upper select gate level 60. The landing pad portion has a larger diameter or width than the second 1L and the third 1M portions of the channel 1.

FIGS. 5A-5C illustrate a lower select gate level 50 of the CVNAND device. FIG. 5C shows a top view and FIGS. 5A and 5B illustrate side cross sectional views along lines A-A' and B-B' in FIG. 5C. The lower select gate level 50 is located over the substrate 100. The lower select gate level 50 includes the lower portions 1L of the plurality of semiconductor channels 1 (containing source regions 103 on the bottom), and a plurality of lower source electrodes 102. Each lower source electrode is electrically connected to each of the plurality of lower portions 1L of the semiconductor channels through a respective source region 103. Level 50 also includes the plurality of lower select gate electrodes 51, located adjacent to a gate dielectric 54 contacting the lower portion 1L of each semiconductor channel 1. The channel 1L, gate dielectric 54 and select gate 51 form the lower (source) select transistor 16L of each NAND string. Strip shaped lower select gate lines 52 connect the select gates 51 in rows to input/outputs (not shown), as shown in FIGS. 5B and 5C. Level 50 is formed before the layers of the memory level 70 are formed over level 50 to allow the select gates 50 to be separated.

Figure 6A:
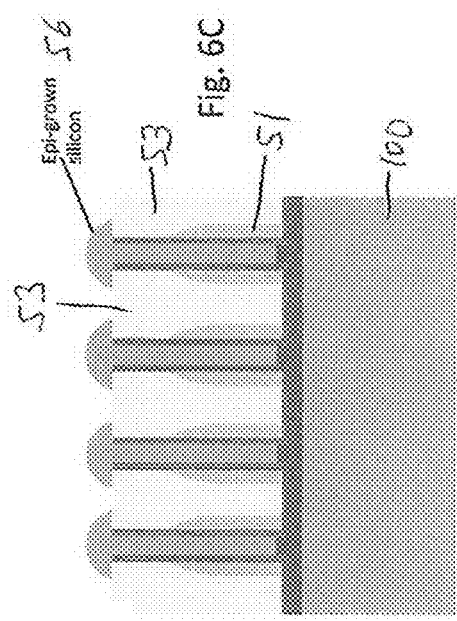
FIGS. 6A, 6B, 6C and 6D are side cross sectional views of steps in the method of making the lower select gate device level of the NAND memory device of an embodiment of the invention.

FIGS. 6A-6D illustrate steps in forming this level 50 shown in FIG. 5A. As shown in FIG. 6A, the lower portions 1L of the channel 1 may be formed by etching a silicon substrate 100 to form silicon pillars 1L using any suitable lithography and etching technique. Alternatively, pillars 1L may be grown in openings in a mask located over the substrate 100. In this case, the select gate device level 50 is lifted up over the substrate 100 surface 100a, so that the select transistors 16L have polysilicon channels 1L and CMOS devices may be formed in single crystal silicon substrate 100 under the NAND array. This option is less preferred.

This is followed by oxidizing the pillars 1L to form a silicon oxide gate dielectric 54 on pillar sidewall(s) and on exposed portion of substrate 100 surface 100a. Alternatively, the gate dielectric may be deposited on the pillars 1L and the surface 100A of the substrate 100 by CVD or other suitable methods. In this case, the dielectric 54 may comprise materials other than silicon oxide.

Finally, the upper surface 100A of the substrate 100 is doped (e.g., by ion implantation) to form the source regions 103 and the source electrode 102 (i.e., buried doped source line in substrate 100). The buried source line 102 in the substrate 100 is made by a high dose implant. Alternatively, an optional a buried metal mesh (e.g., tungsten, etc.) may be provided in addition to or instead of the buried implanted lines 102 as the source electrode(s). Source regions 103 may be formed by angled ion implantation (e.g., phosphorus or arsenic implant into a p-type silicon substrate) into the base of the pillars 1L. The implantation may be conducted before or after the dielectric 54 formation or after the select gate 51 formation as it is described below.

Figure 6B:
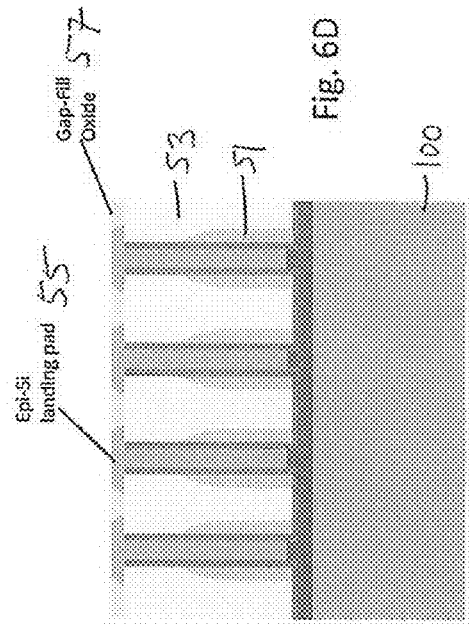

Next, as shown in FIG. 6B, during a step of forming the lower select gate level 50, each lower select gate electrode 51 is separated from adjacent lower select gate electrodes in the array by an air gap or a dielectric filled trench 53. This may be done by forming the select gate 51 layer over the dielectric 54 covered lower portions 1L of the channel 1 followed by anisotripically etching the select gate layer to leave discreet, separated sidewall spacer shaped select gates 51 on the gate dielectric 54 covered lower portions 1L of the channel. The space between the spacer gates 51 may be left as an air gap or filled with an dielectric fill 53. Alternatively, select gates 51 may be formed by depositing a conductive layer and patterning it by lithography and etching into discreet gates 51. If desired, portions of the gates 51 of transistors 16L may be silicided.

The select gate lines 52 are then formed to connect the discreet select gates into rows. The lines 52 may be formed by depositing one or more conductive layers and then performing lithography and etching to form the strip shaped lines 52. The lines 52 are separated from each other in the A-A direction but not in the B-B direction in FIG. 5C.

Figure 6C:
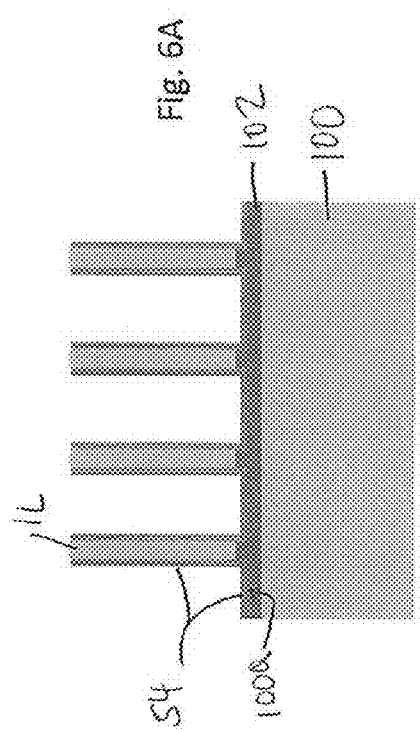
Figure 6D:
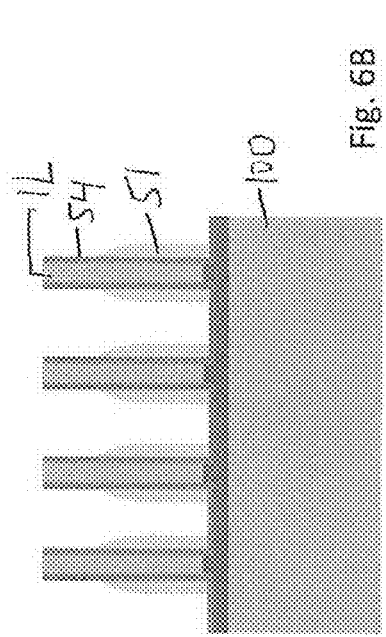

Then, as shown in FIGS. 6C-6D, the optional semiconductor landing pad 55 may epitaxially grown over each lower portion 1L of the plurality of semiconductor channels 1 exposed in the dielectric filled trenches 53 in the lower select gate level 50, such that the landing pad has a larger width or diameter than an underlying lower portion of the channel.

The landing pad 55 formation may comprise epitaxially growing a "mushroom head" shaped overgrown silicon 56 on exposed portions 1L of the channels 1. This silicon overgrowth 56 is then covered by an insulating gap fill layer (e.g., silicon oxide or nitride). The silicon mushroom head 56 and the gap fill layer are then planarized (e.g., by CMP) to form planar landing pads 55 on each pillar 1L separated by an insulating gap fill 57, as shown in FIG. 6D.

FIGS. 7-10 illustrate a method of making the lower portion of the memory device levels 70 of FIGS. 4A and 3A after the step of forming a lower select gate level 50 according to an embodiment of the invention. The memory device levels 70 comprise a plurality of NAND string portions.

Referring to FIG. 7, a stack 120 of alternating layers 121 (121a, 121b, etc.) and 132 (132a, 132b etc.) is formed over the completed lower select gate device level 50 which is located over major surface of the substrate 100. Layers 121, 132 may be deposited over the substrate by any suitable deposition method, such as sputtering, CVD, PECVD, MBE, etc. The layers 121, 132 may be 6 to 100 nm thick. The stack 120 may be covered with an optional cap layer of insulating material 200 different from materials 121 and 132.

In this embodiment, the first layers 121 comprise an electrically insulating material, such as silicon oxide, silicon nitride, high-k dielectric (e.g., organic or inorganic metal oxide), etc. The second layers 132 are sacrificial layers. Any sacrificial material that can be selectively etched compared to material 121 may be used for layers 132, such as conductive or insulating or semiconducting material. For example, the sacrificial material for layers 132 may be silicon nitride when material of layers 121 is silicon oxide.

The deposition of layers 121, 132 is followed by etching the stack 120 to form a plurality of memory holes 84. An at least a 3×3, such as an at least 6×6 array of memory holes 84 may be formed in locations where vertical channels of NAND strings will be subsequently formed.

The middle semiconductor channel 1 portions 1M are then formed on the landing pads 55 exposed in the memory holes 84. The channel portions 1M may be filled with insulating fill 2 (as shown in FIG. 4A) or may comprise a solid rod (as shown in FIGS. 3A and 7).

Preferably, the channel 1 portions 1M material comprises lightly doped p-type or n-type (i.e., doping below $10^{17}$ cm$^{-3}$) silicon material (e.g., polysilicon). An n-channel device is preferred since it is easily connected with n+ junctions (i.e., source 103 and drain 203 n+ doped regions having a doping concentration between $10^{17}$ cm$^{-3}$ and $10^{21}$ cm$^{-3}$). However, a p-channel device may also be used. Other semiconductor materials (e.g., SiGe, SiC, Ge, III-V, II-VI, etc.) may also be used.

The semiconductor channel 1 may be formed by any desired methods. For example, the semiconductor channel material 1 may be formed by depositing semiconductor (e.g., polysilicon) material in the holes 84 and over the stack 120 (e.g., by CVD), followed by a step of removing the upper portion of the deposited semiconductor layer by chemical mechanical polishing (CMP) or etchback using top surface of the stack 120 as a polish stop or etch stop.

In some embodiments, a single crystal silicon or polysilicon vertical channel 1 may be formed by metal induced crystallization ("MIC", also referred to as metal induced lateral crystallization) without a separate masking step. The MIC method provides full channel crystallization due to lateral confinement of the channel material in the hole 84.

In the MIC method, an amorphous or small grain polysilicon semiconductor (e.g., silicon) layer can be first formed in the holes 84 and over the stack 120, followed by forming a nucleation promoter layer over the semiconductor layer. The nucleation promoter layer may be a continuous layer or a plurality of discontinuous regions. The nucleation promoter layer may comprise any desired polysilicon nucleation promoter materials, for example but not limited to nucleation promoter materials such as Ge, Ni, Pd, Al or a combination thereof.

The amorphous or small grain semiconductor layer can then be converted to a large grain polycrystalline or single crystalline semiconductor layer by recrystallizing the amorphous or small grain polycrystalline semiconductor. The recrystallization may be conducted by a low temperature (e.g., 300 to 600 C) anneal.

The upper portion of the polycrystalline semiconductor layer and the nucleation promoter layer can then be removed by CMP or etchback using top surface of the stack 120 as a stop, resulting in the structure as shown in FIG. 7. The removal may be conducted by selectively wet etching the remaining nucleation promoter layer and any formed silicide in the top of layer following by CMP of the top of silicon layer using the top of the stack 120 as a stop.

Following formation of the channel 1 portions 1M, at least one slit trench 81 (also shown in FIG. 4B) is formed in the stack 120. The openings 81, 84 may be formed by forming a mask (e.g., a photoresist mask) by photolithography followed by etching unmasked areas. The slit trench opening 81 may be in the shape of a cut traversing more than one NAND string as illustrated in FIG. 4B. The slit trenches 81 allow back side access to the vertical NAND strings located in memory holes 84 for the control gate 3 formation in the "gate last" process.

Next, as shown in FIG. 8, the sacrificial material 132 is selectively etched compared to the first layer 121 material to form recesses 62. The recesses 62 may be formed by selective, isotropic wet or dry etching which selectively etches the sacrificial material 132 compared to the first layer insulating material 121 through the slit trenches 81. The recess 62 extends to the channel 1 portions 1M. Preferably, the entire layers of first sacrificial material 132 between the first layers 121 are removed up to the channel 1 portions 1M.

The memory film 13 is then formed in the recesses 62 as shown in FIG. 9. This includes forming a tunnel dielectric 11 in the recesses over the channel portions 1M located in the memory openings 84, forming a charge storage region 9 over the tunnel dielectric, and forming a blocking dielectric 7 over the charge storage region in the recesses 62. The blocking dielectric 7 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 7 may have a thickness of 6 to 20 nm. The charge storage region 9 may comprise a silicon nitride layer deposited by any suitable method, such as ALD, CVD, etc., and have a thickness of 3 to 20 nm. The tunnel dielectric may comprise a relatively thin insulating layer (e.g., 4 to 10 nm thick) of silicon oxide or other suitable material, such as oxynitride, oxide and nitride multi layer stacks, or a high-k dielectric (e.g., hafnium oxide). The tunnel dielectric may be deposited by any suitable method, such as ALD, CVD, etc. Alternatively, the tunnel dielectric may be formed by thermally oxidizing the exposed sidewalls of the middle portions 1M of the channel 1 exposed in the recesses 62.

The control gates 3 are then formed on the blocking dielectric in the remaining portions of the recesses 62 through the slit trench(es) 81, as shown in FIG. 10. The control gates 3 are preferably metal or metal alloy gates, such as tungsten gates, formed by MOCVD or other suitable methods. Finally, if desired, the slit trenches 81 between array blocks may be filled with a dielectric fill material or they may be left unfilled as air gap trenches. This completes the lower portion of the memory device levels 70.

Then, a landing pad/built-in resistor 25 is formed over the channel 1M, as will be described below with respect to FIG. 16A. The process of FIGS. 7-10 is repeated again one or more times to form one or more upper portions of the memory levels 70 over the completed lower portion of the memory levels 70, as shown in FIG. 16B, and described in more detail below.

FIGS. 11A-11C illustrate the upper select gate level 60 of the device. FIG. 11C shows a top cross sectional view (along lines A-A and B-B in FIGS. 11A and 11B, respectively, with bit line 202 not shown) and FIGS. 11A and 11B illustrate side cross sectional views along lines A-A' and B-B' in FIG. 11C. The upper select gate level 60 is formed over the plurality of memory device levels 70, preferably after levels 70 are completed and preferably without using the stack 120 layers. The upper select gate level 60 comprises upper portions 1U of the plurality of semiconductor channels 1, and a plurality of upper drain electrodes (e.g., bit lines) 202. Each upper source or drain electrode 202 is electrically connected to each of the plurality of upper portions 1U of the semiconductor channels via the drain regions 203. Level 60 also includes a plurality of upper select gate electrodes 61. Each upper select gate electrode 61 is located adjacent to a gate dielectric 64 contacting the upper portion 1U of each semiconductor channel 1. The channel portion 1U, gate dielectric 64 and select gate 61 form the upper (drain) select transistor 16U of each NAND string. The upper select gate lines 66 separated from each other by insulating fill 63 connect the select gates 61 in rows.

The upper select gate level 60 may be formed in the same manner as the lower select gate level 50, except as follows. First, the upper portions 1U (i.e., the channels of the upper select gate transistors 16U) of the channels 1 are grown on the respective middle portions 1M of the channels. Thus, portion 1U may comprise polycrystalline semiconductor (e.g., polysilicon) or recrystallized, nearly single crystal silicon (e.g., recrystallized by the MIC process).

Second, rather than forming landing pads 55, the tops of the pillars 1U are doped with a dopant of the opposite conductivity type (e.g., n-type) than that of the channel 1 portion 1U (e.g., p-type) to form drain regions 203. This may be performed by ion implanting P or As into exposed portions of silicon pillars 1U. Third, as shown in FIG. 11B, the bit lines 202 are formed by a damascene process in rail shaped trenches in a dielectric layer 204 or by forming the dielectric layer 204 around bit line 202 rails. Otherwise, the upper select gate electrodes 61 may be formed by a sidewall spacer process on gate dielectric 64 covered silicon channels 1L of the upper select gate transistors 16U in the same matter as the lower select gate electrodes 51. If desired, portions of the gates 61 and/or the drain 203 of transistors 16U may be silicided.

FIGS. 12A and 12B illustrate exemplary dimensions (in nanometers) of the select transistors 16 and elements of levels 50 and 60, respectively, in units of nanometers. The above configuration provides a dense array for larger block sizes. The CVNAND scales below 5 nm effective half pitch (F/n), where F is the minimum feature size and n is the number of device levels.

The above described NAND device may be programmed and read by conventional NAND techniques. However, since the select gates for each NAND string are separated, the erase operation of the above device may be advantageously performed by a gate induced drain leakage (GIDL) process through the lower select gate source transistor 16L in the lower select gate device level 50. The effective GIDL erase allows erasing of very tall stacks by optimizing the bottom SGS transistor 16L with respect to GIDL current (during erase) and off/leakage currents (during inhibit). This also provides an effective erase from source line 102 side only, which allows optimization of off current and leakage current (during inhibit and read) for top SGD transistor 16U. This allows the device to open up an inhibit window and reduce read current leakage for non selected blocks. It is believed that sub block erase could become effective compared to prior art three dimensional NAND.

FIGS. 13A and 13B are side cross sectional views of a NAND memory device of embodiments of the invention. The devices shown in FIGS. 13A and 13B are similar to the device shown in FIG. 3A above, except that the devices shown in FIGS. 13A and 13B contain a local interconnect (source contact) 302. The local interconnect 302 may extend below the array in the embodiment of FIG. 13A (e.g., the local interconnect may extend in and out of the page under the array in the view of FIG. 13A). Alternatively, the local interconnect 302 may extend in the slit trenches 81 in the embodiment of FIG. 13B. The local interconnect 302 may comprise any suitable conductive material, such as tungsten, aluminum, copper, etc.

In the embodiment of FIG. 13B, the local interconnect 302 comprises a vertical pillar which electrically contacts the lower electrode 102 (e.g., the heavily doped semiconductor region source electrode in the major surface of the semiconductor substrate 100 or another electrode located over the substrate). The upper portion of the local interconnect 302 is in electrical contact with a source line.

In the present embodiment, the slit trenches 81 and the local interconnect 302 extend through the memory device levels 70 and through the dielectric trench fill material 53 to an exposed upper surface of the lower electrode 102. Preferably, the sidewalls of the slit trenches 81 are coated with an insulating layer 304, such as silicon oxide (see FIGS. 14D and 14E), and the local interconnect is formed in the middle of the slit trenches 81 between the insulating layer 304 portions.

As shown in FIG. 13B, the width of the array of vertical NAND strings is defined by the space between adjacent trenches 81, at least one or more of which can be filled with the local interconnect 302. The local interconnect 302 may contact a common lower electrode 102 of adjacent arrays of strings to provide source side erase for the strings in plural arrays of NAND strings at the same time.

The local interconnect may be formed by etching the trenches 81 as described above all the way to the lower electrode 102, forming the insulating layer 304 in the trenches 81 and filling the remaining central space in the trenches with the conductive material of the local interconnect 302. The portions of the conductive layer of the local interconnect 302 and/or insulating layer 304 which extends out of the trenches 81 may be removed by planarization, such as CMP. In the alternative embodiment of FIG. 13A, the local interconnect is formed under the array prior to formation of the array.

Figure 1B:
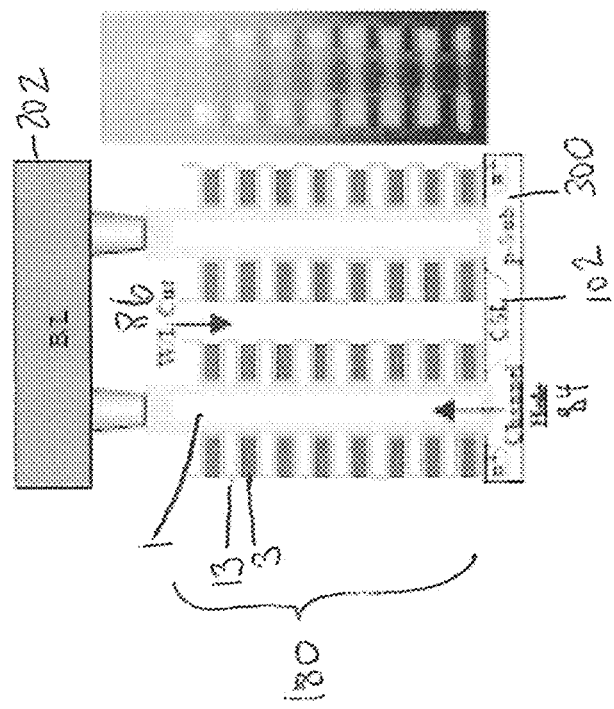
FIG. 1B is a perspective cross sectional view of another prior art NAND memory device.
Figure 14A:
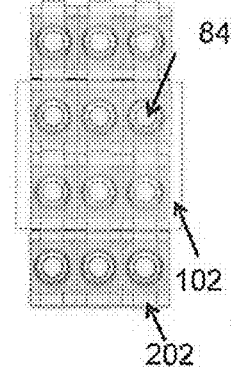
FIG. 14A is a top cross sectional view of the prior art device and FIGS. 14B and 14C are a top cross sectional views of NAND memory devices according to embodiments of the invention.
Figure 14B:
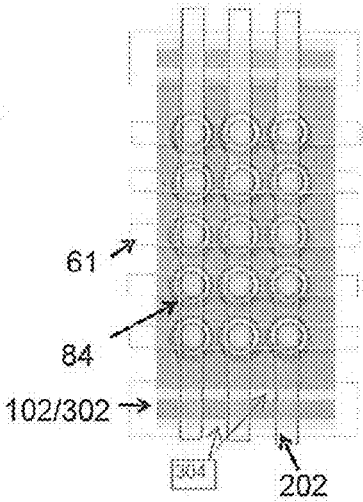
Figure 14C:
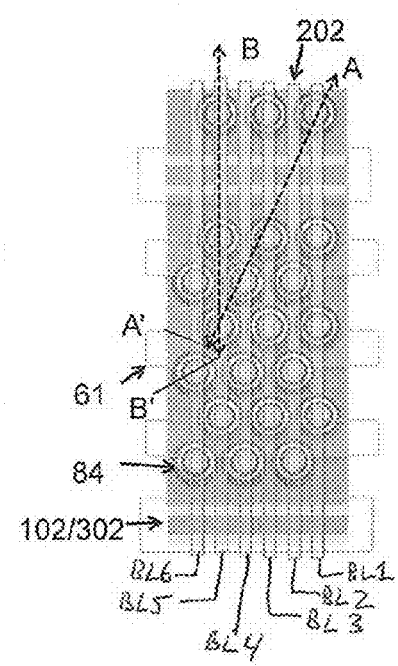

FIG. 14A is a top cross sectional view of the prior art BiCS NAND device shown in FIGS. 1B and 2B. FIGS. 14B and 14C are a top cross sectional views of the CVNAND memory devices according to embodiments of the invention.

As shown in FIG. 14B, the filled memory holes 84 (i.e., holes 84 containing the pillar channel 1 and memory film 13) are arranged in a square or rectangular layout with the memory holes located at corners of an imaginary rectangle or square, similar to the BiCS layout in FIG. 14A. The upper select gates 61, bit lines 202 and local interconnect 302 extending to the lower electrode 102 are also shown in FIG. 14B.

FIG. 14C illustrates an alternative embodiment in which the filled memory holes 84 (i.e., the NAND string channel 1 and memory film 13) are arranged in a substantially hexagonal pattern. This pattern comprises a repeating unit pattern of seven filled memory holes 84 having a central hole 84 surrounded by six other holes 84 arranged in a hexagonal layout around the central hole 84. In other words a central semiconductor channel 1 and memory film 13 unit is surrounded by six other semiconductor channel and memory film units arranged in a hexagonal layout around the central semiconductor channel and memory film unit. The hexagonal pattern has three axes of symmetry, in the same plane, about a point the array. The three axes are separated by substantially 60 degrees from one another. Hence, the memory holes 84 are arranged on a hexagonal grid which is also known as hexagonal tiling, bitruncated hexagonal tiling, or omnitruncated hexagonal tiling. Advantageously, hexagonal packing of the takes only about 87% of the area typically used by the same number of cells using standard rectangular layout shown in FIG. 14A.

The memory holes 84 in the hexagonally tiled configuration of FIG. 14C are staggered along each select gate 51, 61 when viewed from the top, The hexagonally tiled configuration of FIG. 14C provides a relaxed layout (i.e., larger pitch) for the select gates 51, 61 compared to the layout of FIGS. 14A and 14B. However, the density of the array with the hexagonally tiled configuration of FIG. 14C can be increased compared to the layout of FIGS. 14A and 14B, with the bit line 202 pitch reduced by a factor of 2 compared to the one in the layout of FIGS. 14A and 14B.

Figure 14E:
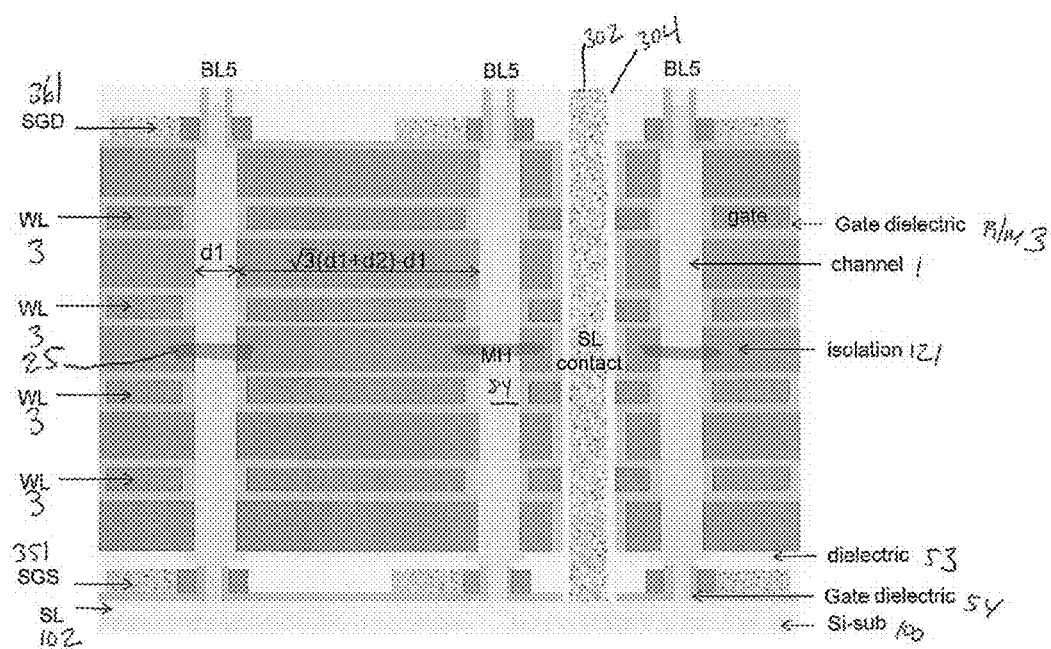

FIGS. 14D and 14E are respective side cross sectional views along lines A-A' and B-B' in FIG. 14C of the CVNAND memory device with the hexagonally tiled memory hole 84 configuration. Line A-A' is a diagonal line through filled memory holes 84 located on bit lines 1, 3, 4 and 5. Line B-B is a line along bit line 5. In the example shown in FIG. 14C, there are six bit lines (BL1, BL2, BL3, BL4, BL5 and BL6) and three select gates 61 which form a 6×3 hexagonally tiled array of eighteen NAND strings between adjacent local interconnects 302. Arrays having a configuration other than 6×3 may also be used as desired.

FIGS. 14D and 14E also illustrate the connector lines 351, 361 for the respective lower select gates 51 and upper select gates 61 of the respective SGS 16L and SGD 16U select transistors. The lines 351, 361 may comprise any suitable conductor, such as tungsten, and may connect the select gates to the driver/control circuits (not shown).

As shown in FIG. 14D, the diameter of each memory hole 84 is labeled d1 and the distance between adjacent memory holes 84 (along the diagonal line A-A' in FIG. 14C) is labeled d2. The distance between adjacent memory holes 84 (along a given bit line, BL5, along the vertical line B-B' in FIG. 14C) is √3*(d1+d2)−d1.

FIGS. 15A to 15H are schematic side cross sectional views of steps in the method of making the vertical pillar shaped channel type NAND memory device with one or more landing pads 25 shown in FIG. 2A. In this method, a lower portion of the channel 1 is formed in the respective lower portion of the memory opening 84 in the lower portion of the stack. This is followed by forming the landing pad 25, forming at least one additional portion of the stack, forming at least one additional portion of the memory opening to expose the landing pad 25 and forming at least one additional portion of the channel 1 in the memory opening in contact with the landing pad 25.

The method begins by forming the lower electrode 102, such as by implanting a heavily doped diffusion region 102 in the upper surface 100*a* of the substrate 100. For example, region 102 may comprise an n+ doped region in a p-type substrate 100, as shown in FIG. 15A. The conductivity types may be reversed if desired. Diffusion (doped) region 102 serves as a common source line of the lower select gate transistor to be formed in region 16LS containing a sacrificial layer 1325 (e.g. a SiN layer).

The lower portion of the memory stack 120L is then formed over the upper surface 100*a* of the substrate 100. The stack contains alternating insulating layers 121, such as silicon oxide layers, and sacrificial layers 132, such as silicon nitride layers. A hard mask 27 is formed over the lower portion of the stack. The hard mask is patterned (e.g., by lithography) and is used as a mask to etch the lower portions of the memory openings 84*x* in the lower portion of the stack 120L. The etching may comprise an RIE or another suitable etching. The hard mask 27 may then be removed or retained in the device. Alternatively, the hard mask is consumed during the etching process.

Then, the lower portion of the channels 1*x* are formed in the lower portion of the memory openings 84*x*, as shown in FIG. 15B. The lower portion of the channels 1*x* may have a pipe shape as illustrated in FIG. 15B, the center of which may be filled with an insulating material 2. Alternatively, the memory openings 84*x* may be completely filled with semiconducting material to form the lower portions of the channels 1x. Any suitable formation method may be used, such as the method described above with respect to FIGS. 7-10.

Figure 15D:
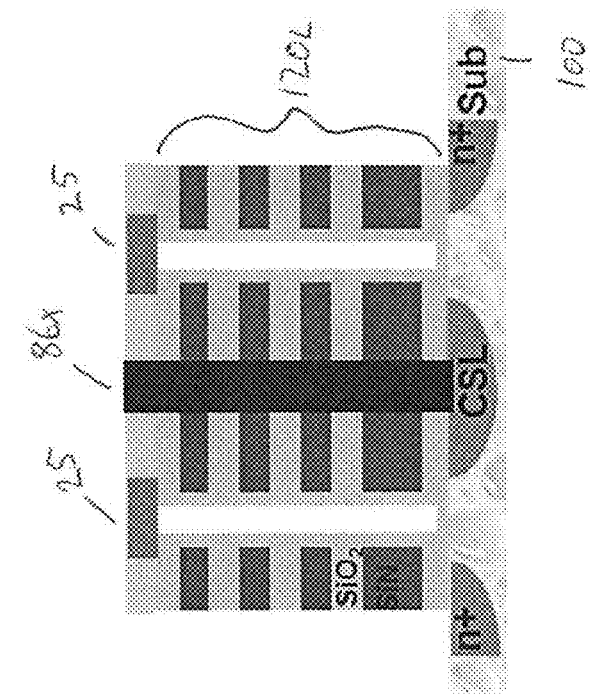
Figure 15C:
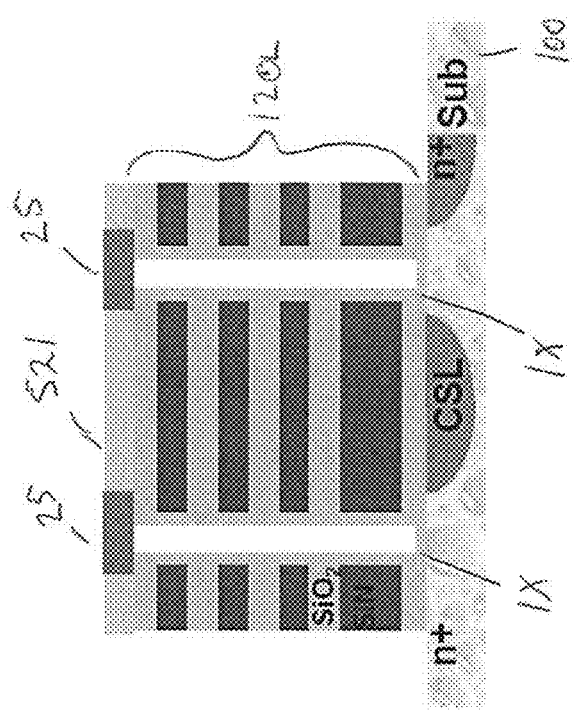

The landing pad 25 is then formed on top of the lower portion of the channel 1x, as shown in FIG. 15C. The landing pad 25 may be formed using any suitable method, such as the method described above for forming the additional landing pad 25 with respect to FIGS. 6C-6D.

For example, a semiconductor landing pad 25 may be epitaxially grown over the each lower portion of the channels 1x exposed in the lower portion of the stack 120L, such that the landing pad has a larger width or diameter than an underlying lower portion of the channel 1x. The landing pad 25 formation may comprise epitaxially growing a "mushroom head" shaped overgrown silicon on exposed lower portions of the channels 1x. This silicon overgrowth is then covered by an insulating gap fill layer (e.g., silicon oxide or nitride). The silicon mushroom head and the gap fill layer are then planarized (e.g., by CMP) to form planar landing pads 25 on each portion of the channel 1x separated by an insulating gap fill 521, as shown in FIG. 15C.

Alternatively, the landing pads 25 may be formed by depositing a conductive or a doped semiconductor layer over the lower portion of the stack 120L and then patterning the layer by lithography and etching to leave landing pads 25 having a larger width than that of the lower channel portion 1x. If the landing pads 25 are made of a doped semiconductor, then the landing pads 25 preferably have a higher doping concentration than the channel 1.

As illustrated in FIG. 15D, a lower portion of the word line cut or trench 86x may then be formed in the lower portion of the stack 120L. This cut or trench 86x may be formed by photolithography and etching. The cut or trench 86x may be filled with a sacrificial or insulating material to protect it during subsequent processing. Alternatively, the portion of the cut or trench 86x is omitted and the entire cut or trench 86 is formed in a single etching step after all of the memory levels are completed. This completes the lower memory level of the NAND device.

Then, the above process may be repeated one or more times to form one or more additional memory levels over the lower memory level. As shown in FIG. 15E, the process of FIGS. 15A-15D is repeated for the middle portion of the stack 120M. Specifically, the middle portion of the stack 120M is formed over the landing pads 25 and the lower portion of the stack 120L containing the lower portions of the channels 1x. Another hard mask is formed over the middle portion of the stack 120M, and the middle portions of the memory openings 84y are etched into the middle portion of the stack 120M to expose the landing pads 25, as shown in FIG. 15E. It should be noted that the lower 84x and middle 84y portions of each memory opening 84 may be partially or completely misaligned with each other, as long the landing pads 25 are exposed in respective middle portions of the memory openings 84y.

Then, the middle portion of the channels 1y are formed in the middle portions of the memory openings 84y, as shown in FIG. 15E. The landing pad 25 is then formed on top of the middle portion of the channel 1y. The landing pad 25 may be formed using any suitable method, such as the method described above. As illustrated in FIG. 15F, a middle portion of the word line cut or trench 86y may then be formed in the middle portion of the stack 120M. This cut or trench 86y may be formed by photolithography and etching, and optionally filled with a sacrificial or insulating material. This completes the middle memory levels.

If desired, one or more additional middle or upper portions of the memory levels are then formed over the middle memory levels. As shown in FIGS. 15E and 15F, the process of FIGS. 15A-15D is repeated for the upper portion of the stack 120U. Specifically, the upper portion of the stack 120U is formed over the landing pads 25 and the middle portion of the stack 120M containing the middle portions of the channels 1y. Another hard mask is formed over the upper portion of the stack 120U, and the upper portions of the memory openings 84z are etched into the upper portion of the stack 120U to expose the landing pads 25, as shown in FIG. 15E. It should be noted that the middle 84y and upper 84z portions of each memory opening 84 may be partially or completely misaligned with each other, as long the landing pads 25 are exposed in respective upper portions of the memory openings 84z.

Then, the upper portion of the channels 1z are formed in the upper portions of the memory openings 84z, as shown in FIG. 15E. The landing pad 25 is then formed on top of the upper portion of the channel 1z. The landing pad 25 may be formed using any suitable method, such as the method described above. The upper select transistor region 16US may also be formed during this step or during a separate step.

As illustrated in FIG. 15F, an upper portion of the word line cut or trench 86z is then formed in the upper portion of the stack 120U. This cut or trench 86z may be formed by photolithography and etching. If the cut or trench portions 86x, 86y were filled with a sacrificial material, then the sacrificial material is removed at this time and the cut or trench may be subsequently refilled with an insulating material. Alternatively, the entire cut or trench 86 is formed in a single etching step at this time through the entire stack 120 as illustrated in FIGS. 15I-15J.

The memory films and the control gate electrodes are then formed in the entire stack 120 using a back side process (similar to the process shown in FIGS. 8-10). First, as shown in FIG. 15G, the sacrificial material layers 132 (such as the silicon nitride layers), are removed from the stack 120 through the cut or trench 86 using a selective wet etch to leave recesses 62 between the insulating layer 121 in the stack 120. The memory film 13 (e.g., an ONO film) is then formed on the surface of the recesses 62 through the cut or opening 86, as shown in FIG. 15H. The control gate electrodes 3, such as metal (e.g. W or Ti) and/or metal nitride, (e.g. WN or TiN) are then formed in the recesses 62 on the memory films 13 through the cut or opening 86, as shown in FIG. 15I.

In an alternative embodiment, the back side process shown in FIGS. 15F-15I is performed on each portion of the stack between the channel and landing pad formation steps rather than on the entire stack. In this alternative method, after the lower portion of the channels 1x are formed in the lower stack portion 120L in FIG. 15B, the cut or trench 86x is formed in the lower portion of the stack 120L and sacrificial material layers 132 are removed to leave recesses 62. The recesses are then filled with the memory films 13 and the control gate electrodes 3. The cut or trench 86x may be filled with an insulating or sacrificial material and the landing pads 25 are then formed on the lower portion of the channels 1x. The process then continues as shown in FIG. 15E.

Then, after the middle portion of the channels 1y are formed in the middle stack portion 120M in FIG. 15E, the cut or trench 86y is formed in the middle portion of the stack 120M and sacrificial material layers 132 are removed to leave recesses 62. The recesses are then filled with the memory films 13 and the control gate electrodes 3. The cut or trench 86y may be filled with an insulating or sacrificial material and the landing pads 25 are then formed on the middle portion of the channels 1y. The process then continues as shown in FIGS. 15E-15H.

Then, after the upper portion of the channels 1z are formed in the upper stack portion 120U in FIG. 15H, the cut or trench 86z is formed in the upper portion of the stack 120L and sacrificial material layers 132 are removed to leave recesses 62. The recesses are then filled with the memory films 13, the control gate electrodes 3 as well as the lower 16LG and upper 16UG select gate electrodes in the respective regions in 16LS and 16US to form the lower 16L and upper 16U select gate transistors. The cut or trench 86z may be filled with an insulating material 87. This results in the device shown in FIG. 15J.

After the control gate electrodes 3 are formed, either by the method of FIGS. 15A-15J or by the alternative method described above, the bit line contact 202 is then formed in contact with the upper channel portion 1z as shown in FIG. 2A or 15K to complete the pillar shaped channel vertical NAND with landing pads 25.

Figure 16A:
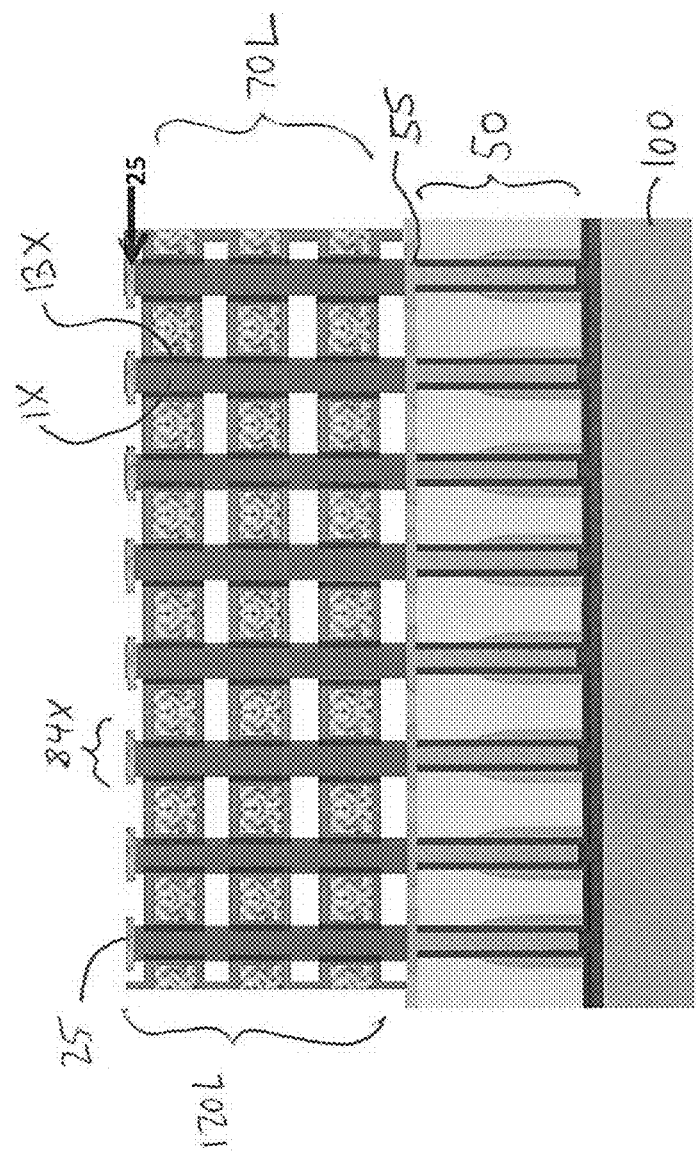

A similar method may be used to form the CVNAND of FIGS. 3A-14E, as shown in FIGS. 16A and 16B. As shown in FIG. 16A, the lower portion of the memory levels 70L is formed over the lower select gate level 50, which is formed using the methods shown in FIGS. 5A-6D. The lower portion of the memory levels 70L includes the lower portion of the memory stack 120L. A hard mask is formed over the lower portion of the stack. The hard mask is patterned (e.g., by lithography) and is used as a mask to etch the lower portions of the memory openings 84x in the lower portion of the stack 120L. The etching may comprise an RIE or another suitable etching. The hard mask may then be removed or retained in the device. Alternatively, the hard mask is consumed during the etching process.

Then, the lower portions of the memory films 13x and the channel 1x are formed in the lower portions of the memory openings 84x as shown in FIG. 16A. Any suitable formation method may be used, such as the method described above with respect to FIGS. 7-10 or the front side method described below with respect to FIGS. 17A-17H. The landing pad 25 is then formed on top of the lower portion of the channel 1x. The landing pad 25 may be formed using any suitable method, such as the method described above. This completes the lower memory levels 70L of the NAND device.

Then, the above process may be repeated one or more times to form one or more additional memory levels 70U over the lower memory levels 70L. As shown in FIG. 16B, the process of FIG. 16A is repeated for the upper portion of the stack 120U. Specifically, the upper portion of the stack 120U is formed over the landing pads 25 and the lower portion of the stack 120L containing the lower portions of the channels 1x. Another hard mask is formed over the upper portion of the stack 120U, and the upper portions of the memory openings 84z are etched into the upper portion of the stack 120U to expose the landing pads 25. It should be noted that the lower 84x and upper 84z portions of each memory opening 84 may be partially or completely misaligned with each other, as long the landing pads 25 are exposed in respective upper portions of the memory openings 84z.

Then, the upper portions of the memory films 13z and the channel 1z are formed in the upper portions of the memory openings 84z as shown in FIG. 16B. The upper select transistor level 60 is then formed over the upper memory levels 70U using the method shown in FIGS. 11A-12B. A similar method to the one described in FIGS. 15A-15F and 16A-16B may be used to form other vertical NAND devices with landing pads, such as P-BiCS type devices.

FIGS. 17A through 17H illustrate another embodiment of making 3D vertical NAND devices. Specifically, FIGS. 17A-17H illustrate a method of overcoming misalignment of the memory holes in making NAND memory devices that have at least two memory stacks. In this embodiment method, lower portions of the memory openings 84x are formed in the lower portion of the stack 120L. This is followed by filling the lower parts 84s of the lower portions of the memory openings 84x with a sacrificial material 31, and widening the remaining exposed top parts 84t of the of the lower portions of the memory openings 84x where the landing pad 25 will be subsequently formed. The widened part 84t is then filled with a sacrificial material. Then, at least one additional portion of the stack 120U is formed over the lower portion of the stack 120L. At least one additional portion (e.g., the upper portions) of the memory openings 84z are formed in the additional portion of the stack 120U to expose the sacrificial material in part 84t of the lower portions of the memory openings 84x. Then, the sacrificial material is removed from the entire opening 84 and the entire memory films 13 are formed in the memory openings 84 followed by forming the entire channels 1 and the landing pads 25 in the memory openings 84 in the same growth step (e.g., CVD growth step). Thus, in this method, the entire channel 1 (including landing pads 25 built into the channel 1) is formed in one step rather than in plural steps by using the sacrificial material to temporarily fill the memory opening portion 84x.

As shown in FIG. 17A, a lower portion of the stack 120L of alternating layers 3, 121 is formed over the major surface 100a of the substrate 100. Layers 3, 121 may be deposited over the substrate by any suitable deposition method, such as sputtering, CVD, PECVD, MBE, etc. The layers 3, 121 may be 6 to 100 nm thick. The substrate 100 may contain a sacrificial material region 29, such as a carbon or other suitable material.

The lower portion of the stack 120L may be covered with an optional cap layer of insulating material 123. The cap layer 123 is preferably thicker than layers 3, 121. For example, layer 123 may be 50-200 nm thick, such as 60-75 nm thick. The cap layer may comprise a silicon oxide layer, such as a silicon oxide layer formed by CVD using a TEOS precursor.

In this embodiment, the first layers 121 comprise an electrically insulating material, such as silicon oxide, silicon nitride, high-k dielectric (e.g., organic or inorganic metal oxide), etc. The second layers 3 comprise control gate material layers rather than the sacrificial material layers 132. The control gate material may comprise any one or more suitable conductive or semiconductor control gate material known in the art, such as doped polysilicon or a metal, such as tungsten, copper, aluminum, tantalum, titanium, cobalt, titanium nitride or alloys thereof. Thus, the stacks 120 in the pillar shaped channel, P-BiCS and/or CVNAND type devices may comprise alternating insulating 121 and sacrificial 132 layers (in the "back-side" process where the sacrificial material layers 132 are removed from the stack and the memory films 13 and control gate electrodes 3 are formed in place of layers 132 through the back side cut and recesses) or alternating insulating 121 and control gate 3 material layers (in a process where the control gate material layers are part of the initial stack and the memory film is formed through the memory holes 84).

The deposition of layers 3, 121 is followed by etching the lower stack portion 120L to form a plurality of lower portions of the memory openings 84x. Then, as shown in FIG. 17B, the etch is continued into the sacrificial material region 29 to remove the sacrificial material and leave a connecting opening 30 which connects two adjacent lower portions of memory openings 84x. The openings 84x will eventually contain the two wing portions 1a and 1b of the U-shape semiconductor channel which extend substantially perpendicular to the major surface 100a of the substrate 100, and the connecting opening 30 will contain the connecting portion 1c of the U-shape semiconductor channel 1 which connects the two wing portions 1a, 1b and which extends substantially perpendicular (i.e., horizontally) to the major surface 100a of the substrate 100.

As shown in FIG. 17C, the lower parts 84s of the lower portions of the memory openings 84x and the connecting opening 30 are filled with a sacrificial material 31. The sacrificial material may comprise any material which may be selectively etched compared to the materials of layers 3 and 121 and the material of the substrate 100. For example, for a silicon substrate 100, polysilicon control gate material layers 3 and silicon oxide layers 121, the sacrificial material 31 may comprise carbon, such as amorphous carbon. However, any other material may also be used.

Then, as shown in FIG. 17D, the remaining exposed top parts 84t of the lower portions of the memory openings 84x are widened such that the top parts 84t have a larger width (e.g., larger diameter) than the bottom part 84s. Preferably, the width (e.g., diameter) of the top part 84t is the same as the intended width (e.g., diameter) of the landing pad 25 which will be subsequently formed in the top part 84t. The widening may be performed by isotropically etching the cap layer 123 without substantially etching the sacrificial material 31 in the lower parts 84s of the lower portions of the memory openings 84x. The widened top parts 84t are then refilled with the sacrificial material 31a. Material 31a may be the same or different from material 31. Material 31a may be recessed to the top of the cap layer 123 by CMP or etchback.

Then, at least one additional portion of the stack (e.g., the upper portion of the stack) 120U is formed over the lower portion of the stack 120L, as shown in FIG. 17E. The additional portion of the stack 120U may also comprise alternating layers 3 and 121 described above. At least one additional portion (e.g., the upper portions) of the memory openings 84z are formed in the additional portion of the stack 120U to expose the sacrificial material 31a in the top part 84t of the lower portions of the memory openings 84x. If desired, the upper portions of the memory openings 84z may be intentionally or unintentionally misaligned with the lower parts 84s of the lower portions of the memory openings 84x, as long as the upper portions of the memory openings 84z expose a portion of the sacrificial material 31a in the widened top parts 84t of the lower portions of the memory openings 84x.

As shown in FIG. 17F, the sacrificial material 31, 31a is removed from the entire memory opening 84 (i.e., from both parts 84s and 84t). This may be performed by selectively etching away the sacrificial material in the memory opening. This forms the continuous memory openings 84 that extend through both the lower 120L and upper 120U portions of the stack 120. Each memory opening 84 includes portions 84z and 84x (which is made up of parts 84s and 84t) and the connecting opening 30.

The entire memory films 13 are then formed in the memory openings 84 in the entire stack, as shown in FIG. 17G. The memory films 13 are formed as hollow cylinders around the sidewalls of the openings 84.

This is followed by forming the entire U-shaped channels 1 and the landing pads 25 in the memory openings 84 in the same growth step inside the hollow memory film 13 cylinder. The two wing portions 1a and 1b of the U-shape semiconductor channel 1 extend substantially perpendicular to the major surface 100a of the substrate 100 in portions 84z, 84x of the memory openings, and the connecting portion 1c of the U-shape semiconductor channel 1 which connects the two wing portions 1a, 1b extends substantially perpendicular (i.e., horizontally) to the major surface 100a of the substrate 100 in the connecting opening 30. In this embodiment, the landing pad 25 may be relatively thick and contact dummy control gates 3d, as shown in FIG. 17G. Dummy control gates 3d (i.e., dummy word lines) are not connected to outside control circuitry and are not provided with a current or voltage during NAND operation.

A slit trench or cut 86A is then formed between the select gates 3 and the wings or arms of the U-shaped channel 1, as shown in FIG. 17H. The slit trench or cut 86 may be etched until the etch stop layer 89 shown in FIG. 2B is reached during the etching. The trench or cut 86A may be filled with an insulating material 87, such as silicon nitride. The select gate transistors 16, the source line 102 and the bit line 202 are then formed above the device, as shown in FIG. 2B. Optionally, the substrate may include a body contact gate (e.g. bottom gate) 91 located adjacent to the connecting portion 1c of the U-shape semiconductor channel 1, as shown in FIG. 2B.

If desired, the substrate may comprise a silicon on insulator type substrate containing one or more insulating layers 93 (e.g., silicon oxide/silicon nitride/silicon oxide stack) over a silicon wafer, as shown in FIG. 2B.

In another embodiment of the present invention, the vertical NAND devices described above (e.g., pillar shaped channel, P-BiCS or CVNAND type devices) may have a channel 1 comprising a mixed metal oxide semiconductor material. The devices with the mixed metal oxide semiconductor channel may include the landing pads 25 and be made by the sequential stack etching process described above. Alternatively, the vertical NAND devices with the oxide semiconductor channel may exclude the landing pad and have the entire memory holes etched in one step (e.g., such as the devices shown in FIGS. 1A and 1B).

Any suitable mixed metal oxide semiconductor material may be used. For example, the mixed metal oxide semiconductor comprises at least one first transition metal and at least one second metal selected from Group IIIA of the Periodic Table of Elements. The mixed metal oxide semiconductor my comprise one first transition metal from Group IIB (also known as Group 12) of the Periodic Table of Elements and two metals selected from Group IIIA (also known as Group 13) of the Periodic Table of Elements. Preferably, the mixed metal oxide comprises indium gallium zinc oxide (stoichiometric $InGaZnO_4$ or non-stoichiometric material). Other mixed metal oxide semiconductors, such as zinc tin oxide (stoichiometric $ZnSnO_3$ or non-stoichiometric material) or indium zinc oxide may also be used. The mixed metal oxide channels have a low leakage current and may be deposited at a low temperature (e.g., below 300 C, such as 100-270 C) into high aspect ratio memory holes 84 using atomic layer deposition (ALD) or other suitable methods.

FIGS. 18A to 18F are side cross sectional views of steps in the method of making the NAND memory device according to another embodiment. This embodiment includes a lower stack 120L of alternating control gate electrodes 3 and dielectric fill material 121 provided over a substrate 100. In an embodiment, the device includes an etch stop layer 89 located between a top surface of the substrate 100 and the stack 120L. As discussed in the previous embodiment, an optional sacrificial material region 29 which may be used to form a horizontal portion of a U-shaped channel 1 may also be provided.

Figure 18A:
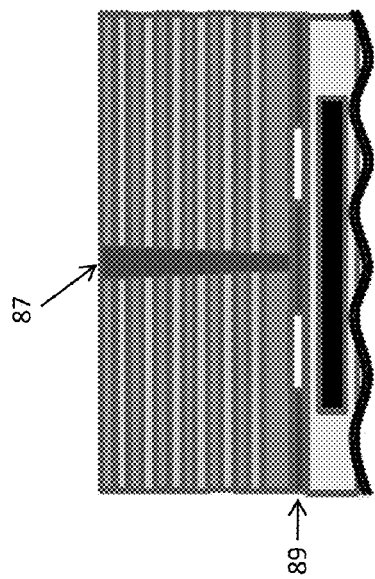
FIGS. 18A to 18F are side cross sectional views of steps in method of making the NAND memory device with a current boosting layer according to another embodiment.
Figure 18B:
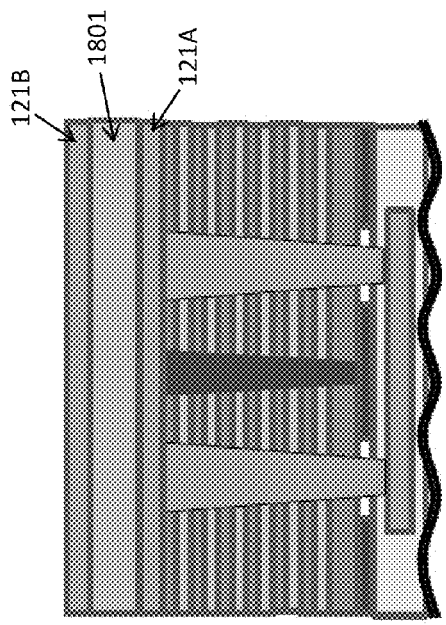
Figure 18C:
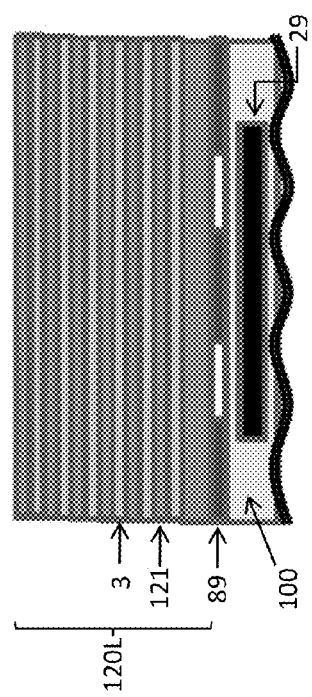

Next, an optional slit trench may be etched to the etch stop layer 89 between the wings or arms of the U-shaped channel 1 and filled with a dielectric 87 as illustrated in FIG. 18B. Memory openings may then be etched through the stack 120 and the etch stop layer 89 to the sacrificial material region 29. The sacrificial material in sacrificial material region 29 is removed and the memory films (i.e. the blocking dielectric 7, charge storage regions 9, and tunnel dielectric 11) and channels 1 are formed in the memory openings as illustrated in FIG. 18C.

Figure 18D:
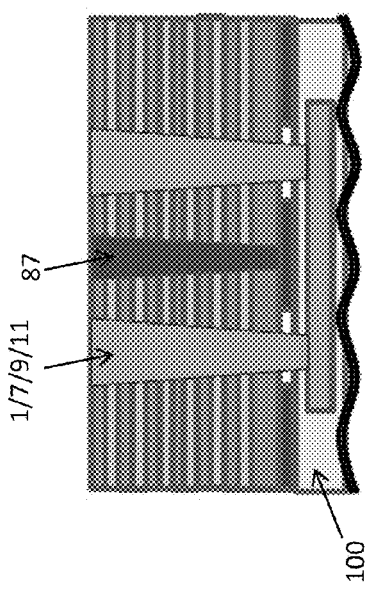
Figures 18E, 18F:
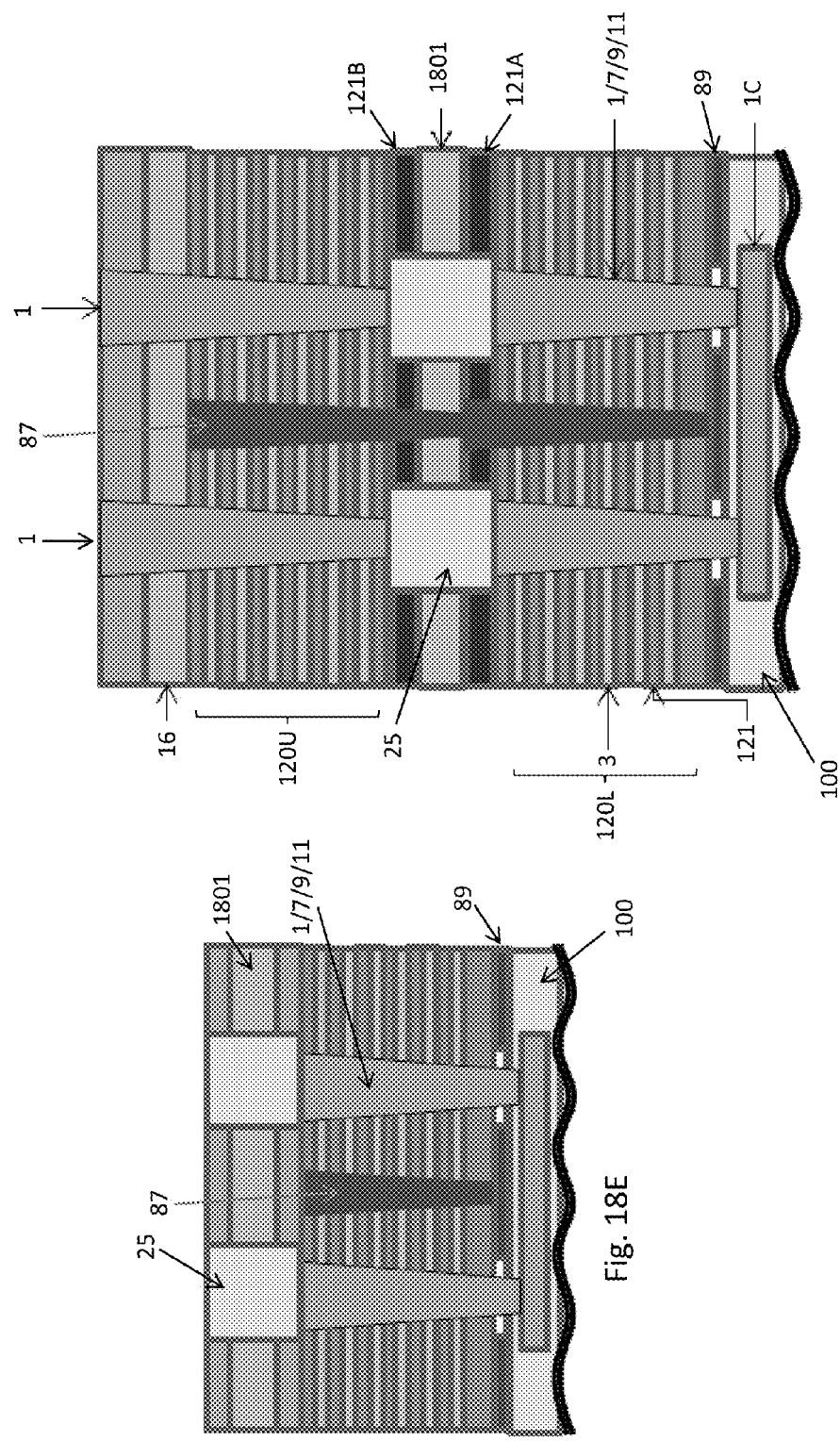

Next, as illustrated in FIG. 18D, a first insulating layer 121A, such as an oxide, is deposited over the stack 120L. A conducting or semiconducting current boosting layer 1801 is deposited over the insulating layer 121A. The current boosting layer 1801 may be a metal (e.g. tungsten or titanium), metal nitride, (e.g. WN or TiN), silicide or highly doped polysilicon (e.g., dopant concentration of at least $10^{18}$ cm$^{-3}$). A second insulating layer 121B (e.g., silicon oxide) is then deposited over the current boosting layer 1801. As illustrated in FIG. 18E, a mask, such as a photoresist mask, may be applied to the surface of the second insulating layer 121B and patterned. Portions of the second insulating layer 121B, the current boosting layer 1801 and the first insulating layer 121A located over the memory holes may be removed by etching. A conducting or semiconducting material may then be deposited in the etched portion of the mask to form thick landing pads 25. That is, landing pads 25 may have a thickness greater than the thickness of the current boosting layer 1801 (e.g. 10-200% thicker, such as 50-100% thicker). The thick landing pads 25 are in electrical contact with both the current boosting layer 1801 and the channel 1. Alternatively, the current boosting layer 1801 may be thicker or the same thickness as the landing pads 25. Current flow in the NAND device can be boosted by applying a voltage to the current boosting layer 1801.

Next, as illustrated in FIG. 18F, the mask may be removed and a second, upper stack 120U of alternating control gate electrodes 3 and dielectric fill material 121 may be deposited over the second insulating layer 121B and the thick landing pads 25. The optional slit trench may then be extended through the upper stack 120U by etching to form a slit trench through the upper stack, the current boosting layer and the first and second insulating layers sandwiching the current boosting layer to the filled slit trench in the lower stack and filling the slit trench with a dielectric. After completing the filled slit trench, the select gates 16 may be formed over the upper stack 120U.

FIG. 18G illustrates another embodiment of a vertical NAND device with a current boosting layer 1801 and landing pad 25. Unlike the vertical NAND device illustrated in FIGS. 18A-18F which have a "U" shaped channel 1, the vertical NAND device illustrated in FIG. 18G has a single vertical pillar shaped channel. The vertical NAND device illustrated in FIG. 18G includes a lower select gate electrode 16L located proximal to the substrate 100 under the memory cells and the control gate electrodes, and an upper select gate electrode 16U located over the memory cells and the control gate electrodes. As in the previous embodiment, the vertical NAND device of this embodiment may have more than two stacks 120 of alternating control gate electrodes 3 and dielectric fill material 121. Further, if the vertical NAND device includes more than two stacks 120, then the device may have more than one current boosting layer 1801 (e.g. if the vertical NAND device has three stacks 120L, 120M, 120U, then the device may include a current boosting layer 1801 between the lower stack 120L and the middle stack 120M and a current boosting layer 1801 between the middle stack 120M and the upper stack 120L).

The current boosting layer 1801 is electrically connected to a voltage or current source and to the landing pad embedded in the semiconductor channel. In operation of the vertical NAND device, current or voltage may be applied to the current boosting layer 1801 during at least one of a read, program or erase steps of the vertical NAND device. In this manner, additional current or voltage may be provided to an interface region containing the landing pad between the upper and lower stacks 120U, 120L (and any intermediate stacks 120, if provided). The applied current or voltage assists in charge carrier (e.g., electron or hole) flow through the landing pad and the interface region. The additional current or voltage improves operation of the device (e.g. provides additional current flow between the select transistors 16L, 16U in each memory string), thereby increasing the reliability of operation by ensuring that sufficient current or voltage is available for proper operation of the stacks 120 of memory device levels in the NAND device.

FIGS. 19A to 19D illustrate a method of making the NAND memory device according to another embodiment. FIG. 19E is a schematic circuit diagram of the device of FIG. 19D. In this embodiment, at least one landing pad is located between a select gate electrode and an end control gate electrode in the stack. For example, the select gate electrode may comprise an upper select gate electrode and the end control gate electrode may comprise a top control gate electrode in the stack, and/or the select gate electrode may comprise a lower select gate electrode and the end control gate electrode may comprise a bottom control gate electrode in the stack.

As illustrated in FIG. 19A, this embodiment includes a stack 120 of alternating control gate electrodes 3 and dielectric fill material 121 provided over a substrate 100. In an embodiment, the substrate 100 may comprise a silicon on insulator type substrate containing one or more insulating layers 93 (e.g., silicon oxide/silicon nitride/silicon oxide stack) over a silicon wafer, as shown in FIG. 19A. Additionally, the substrate may include a bottom gate 91. To protect the bottom gate 91 during subsequent processing, an etch stop layer 89 may be provided between the bottom gate 91 and the stack 120.

In previous embodiments, landing pads 25 were provided between memory stacks 120. In this embodiment, the device includes at least one semiconductor or electrically conductive landing pad 2001 located between the stack(s) 120 of alternating control gate electrodes 3 and dielectric fill material 121 and at least one select gate electrode 16. Preferably, the landing pad 2001 is located between an upper select gate electrode 16 and an upper most control gate electrode 3 in the stack 120. Alternatively, or in addition the landing pad 2001 may be located between the lower select gate electrode (e.g., 16L in FIG. 18G) and the lower most control gate electrode 3 in a vertical NAND string having a single vertical pillar channel, such as the string shown in FIG. 18G. In an embodiment, a landing pad 2001 is provided between at least one of (1) the source select gate electrode 16S and the first and the second control gate electrodes 3 and (2) the drain select gate electrode 16D and the first and the second control gate electrodes 3. Preferably, landing pads 2001 are provided for both the source select transistor 2003 channel 1S and the drain select transistor 2005 channel 1D for embodiments with U-shaped channels as illustrated in FIGS. 19B-19E. For NAND strings with a vertical channel (e.g., such as the strings shown in FIGS. 2A and 3A), one landing pad 2001 is shown as being provided for the channel of the upper select gate transistor (which may be either the source select transistor or the drain select transistor, depending on the direction of the current flow). Landing pad 2001 allows optimization of the select transistor 16 separate from the rest of the memory string which may improve the inhibit performance of the NAND string. The landing pad 2001 in or below the select gate transistor may be used instead of or in addition to the landing pads 25 located in the stack 120 between control gate electrodes 3, as described above.

As illustrated in FIG. 19B, after the memory holes 84 filled are with blocking dielectric 7, charge storage material 9, tunnel dielectric 11 and channel 1, the surface may be planarized, such as with CMP. A layer of conducting material, such as a metal (e.g. W or Ti), metal nitride (e.g. WN or TiN), silicide or doped polysilicon may be deposited over the stack 120. The layer of conducting material is then patterned to form the landing pads 2001 over the memory holes 84. A layer of dielectric fill material 121A is then deposited over the stack 120 and the landing pads 2001. CMP may then be performed to remove excess material 121A and expose the top surface of the landing pads 2001. Alternatively, layer 121A may be deposited first, followed by formation of a landing pad opening in layer 121A, filling the opening with the landing pad 2001 material and optional planarization of the landing pad material with the upper surfaces of layer 121A.

Figure 19D:
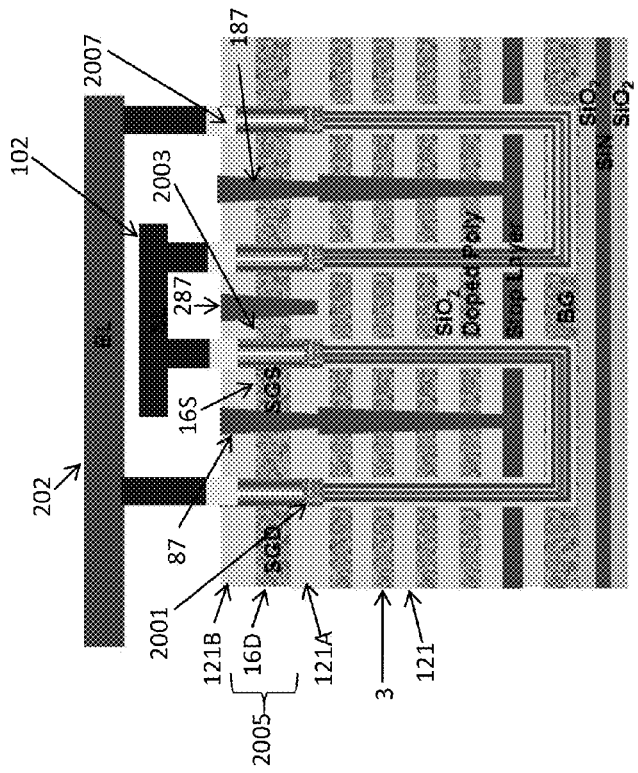
Figure 19C:
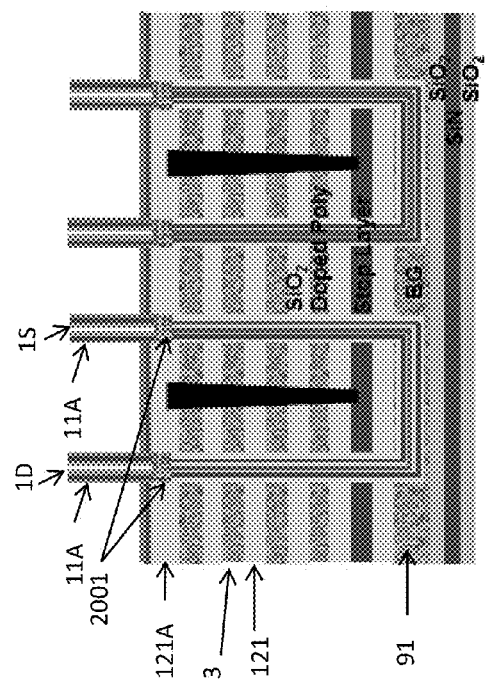
Figure 19E:
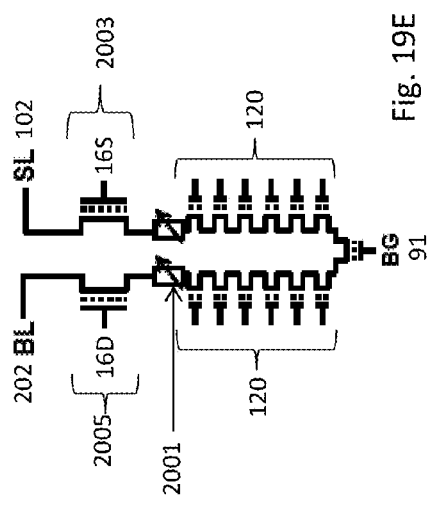
FIG. 19E is a schematic circuit diagram of the device of FIG. 19D.

As illustrated in FIGS. 19C and 19D, the source and drain side select transistors 2003, 2005 (or the upper select transistor 16U for a CVNAND) may then be formed. In the embodiment illustrated in FIGS. 19C and 19D, the transistor channels are formed by a non-damascene process. In this embodiment, a layer of channel material is deposited over the dielectric fill material 121A and the exposed landing pads 2001. Pillar shaped channels 1S, 1D are formed on top of the landing pads 2001 by patterning the layer of channel material (e.g., by photolithography and etching).

Next, a gate insulating layer 11A is formed on the sidewalls of the pillar shaped channels 1S, 1D. The gate insulating layer 11A may be formed by oxidizing the exposed channel sidewalls to form a high quality grown silicon oxide. The top of the channels may be either masked or left unmasked and oxidized. If the top of the channels is oxidized, then the oxide on the top of the channels is removed in a subsequent step. Alternatively, the gate insulating layer 11A may be formed by depositing a layer of silicon oxide, silicon nitride, a combination thereof or another insulating material over the pillar shaped channels.

Next, an optional insulating layer (e.g., the upper portion of insulating layer 121A) and a layer of conducting or doped semiconductor material (e.g., in-situ doped polysilicon) are deposited around the pillar shaped channels 1S, 1D and the gate insulating layer 11A and patterned to form the select gates 16S, 16D (or 16U for a vertical channel string). The patterning may utilize a sacrificial or etch stop layer which is subsequently removed. A second insulating layer 121B is then formed over the select gates and the top of the channels is subsequently exposed in the layer 121B by planarization and/or photolithography and etching.

Dielectric filled slit trench regions 187 and the select gate separation openings 287 are formed by etching the select gate layer and filling the etched trenches and openings with an insulating material (e.g., silicon nitride), as shown in FIG. 19D. This separates the select gate layer into the source and drain select gates 16S, 16D.

As shown in FIG. 19D, bit lines 202 and the source lines 102 (for the U-shaped embodiment) can be fabricated in contact with the select gate transistor channels 1D, 1S as discussed above to complete the NAND string device. If desired, barrier, contact or adhesion regions (e.g., Ti, TiN, metal silicide, etc.) 2007 may be formed between the lines 102, 202 and the respective channels 15, 1D. For example, regions 2007 may comprise metal silicide regions (e.g., titanium silicide or tungsten silicide) formed by contacting the top of the channels with a metal layer and annealing to form the silicide, This step is followed by forming the lines 102 and 202 in contact with the silicide regions 2007. Regions 2007 may be formed before forming the regions 187, 287, while lines 102, 202 may be formed after forming the regions 187, 287.

In an alternative embodiment, the select gates transistor may be formed using a damascene process. In the damascene process, rather than deposit and pattern a layer of channel material, the channel is formed by depositing a channel material and gate insulating layer into an opening in a mini-stack of layers 121A, 16S/16D, 121B.

Figure 20B:
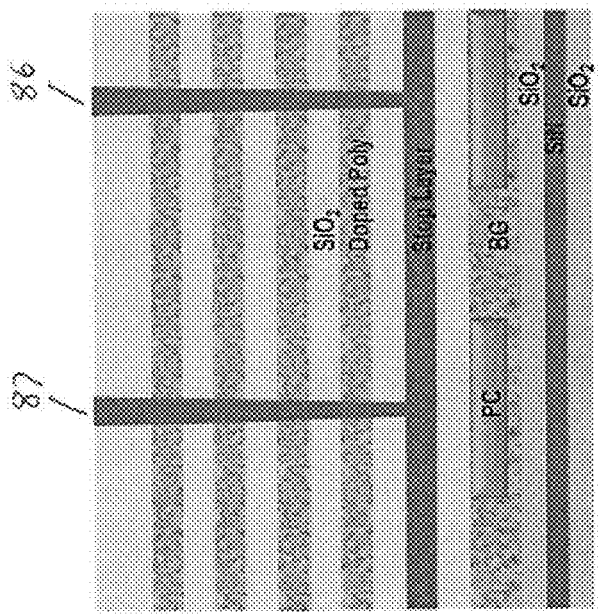
Figure 20A:
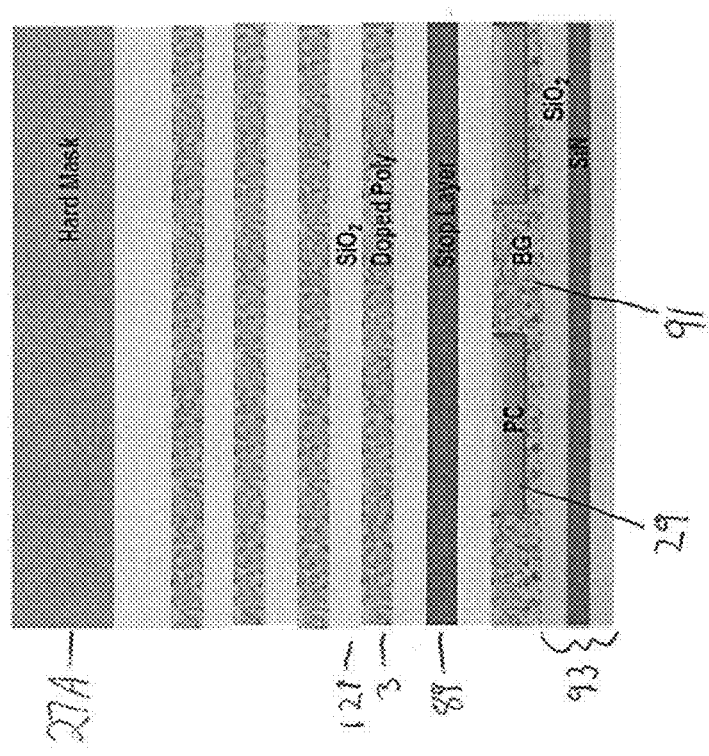

In another embodiment shown in FIGS. 20A-20J, a different method is used to form the P-BiCS type vertical NAND devices, from that illustrated in FIGS. 17A through 17H. As illustrated in FIG. 20A, this embodiment includes a stack 120 of alternating control gate electrodes 3 (e.g. polysilicon) and dielectric fill material 121 (e.g. $SiO_2$) provided over a substrate. In an embodiment, the substrate may comprise a silicon on insulator type substrate containing one or more insulating layers 93 (e.g., silicon oxide/silicon nitride/silicon oxide stack) over a silicon wafer, as shown in FIG. 20A. Additionally, the substrate may include a bottom gate 91. To protect the bottom gate 91 during subsequent processing, an etch stop layer 89 (e.g. SiN) may be provided between the bottom gate 91 and the stack 120. A hard mask 27A (e.g. SiN, amorphous carbon, etc.) is formed over the stack 120.

As illustrated in FIG. 20B, slit trenches 86 are formed in the stack 120 and filled with dielectric 87 using a patterned mask (e.g. patterned hard mask 27A) which is then removed. Preferably, the slit trenches end at the etch stop layer 89. In the next step illustrated in FIG. 20C, the upper most insulating layer 121 in the stack 120 is preferentially etched to reduce its thickness while leaving the dielectric 87 essentially unetched. Another hard mask 27B is then deposited over the upper most insulating layer 120 and the exposed dielectric layer 87.

Figure 20D:
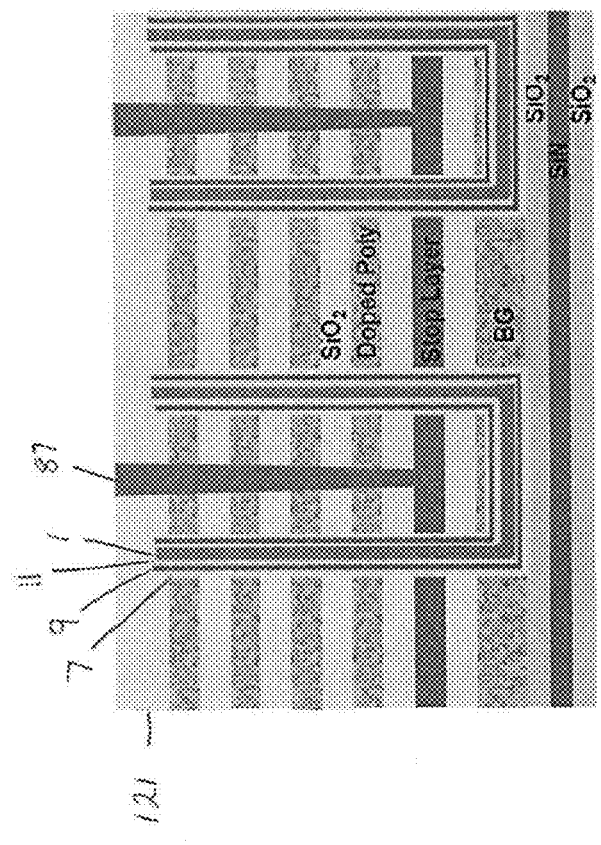
Figure 20C:
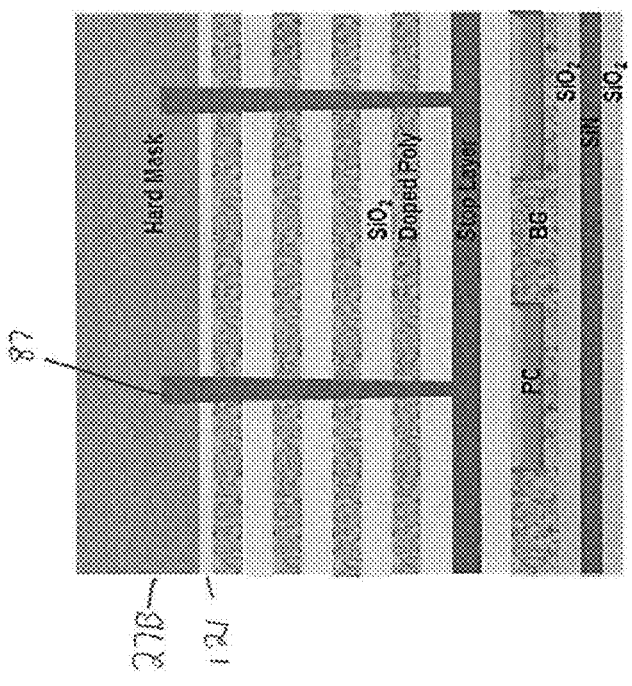

Next, as illustrated in FIG. 20D, memory holes are etched and the sacrificial material region 29 is removed. The memory holes are then filled with blocking dielectric 7, charge storage material 9, tunnel dielectric 11 and channel 1. Additionally, another layer of insulating material 121 is deposited to cover the memory holes and the exposed dielectric 87. A CMP process may then be used to planarize the surface of the stack 120 and to expose a top surface of the dielectric 87.

Figure 20E:
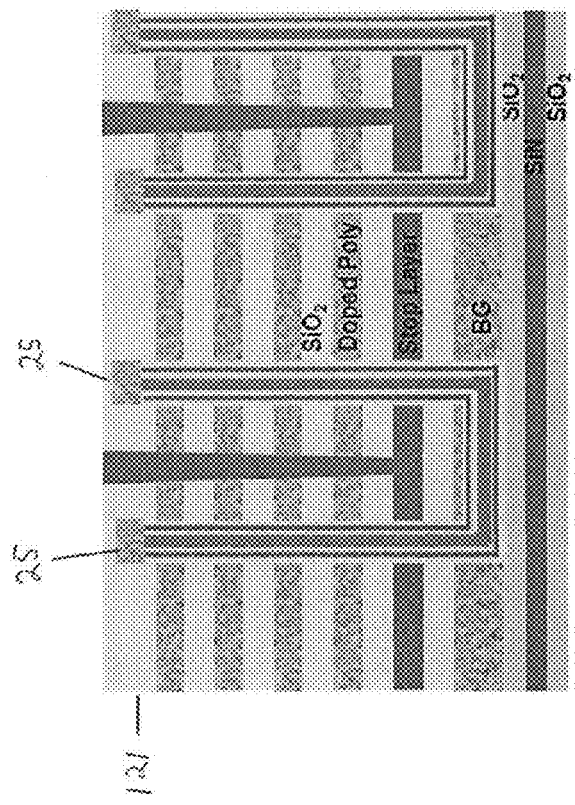

As illustrated in FIG. 20E, holes may be etched in the top insulating layer 121 to expose the top surfaces of the blocking dielectric 7, charge storage material 9, tunnel dielectric 11 and channel 1 in the memory holes. A conducting or semiconducting material may then be deposited in the holes to form landing pads 25 on top of the blocking dielectric 7, charge storage material 9, tunnel dielectric 11 and channel 1. Again, another layer of insulating material 121 is deposited to cover the landing pads 25 and the exposed dielectric 87. A CMP process may then be used to planarize the surface of the stack 120 and to expose a top surface of the dielectric 87.

Figure 20F:
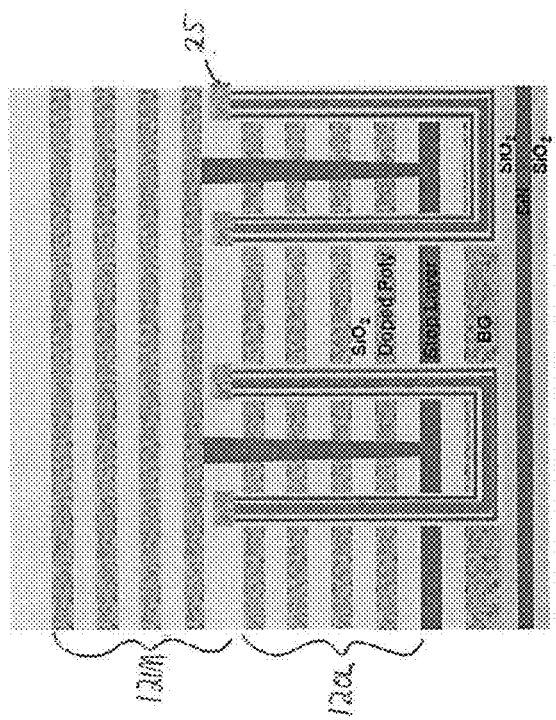

Next, as illustrated in FIG. 20F, a second, middle stack 120M of alternating control gate electrodes 3 and dielectric fill material 121 is deposited over the lower stack 120L of alternating control gate electrodes 3 and dielectric fill material 121. Memory holes 84y and slit trenches 86 are formed in the middle stack 120M as illustrated in FIG. 20G. The memory holes 84y are etched until the surface of the landing pads 25 are exposed. The slit trenches 86 are etched until the upper surface of the dielectric 87 in the lower slit trenches 86 are exposed. Next, both the memory holes 84y and the slit trenches 86 are filled with a dielectric material 87, such as silicon nitride.

Figure 20H:
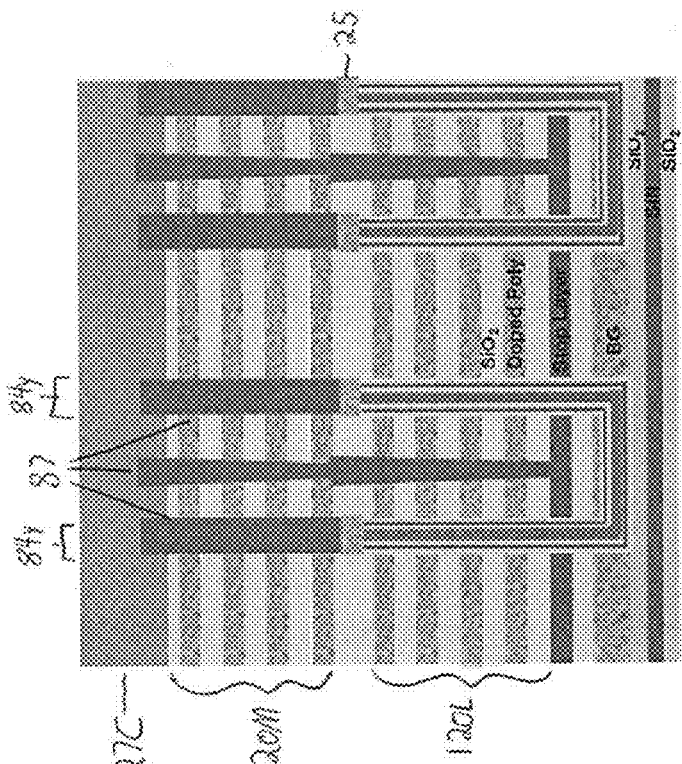
Figure 20G:
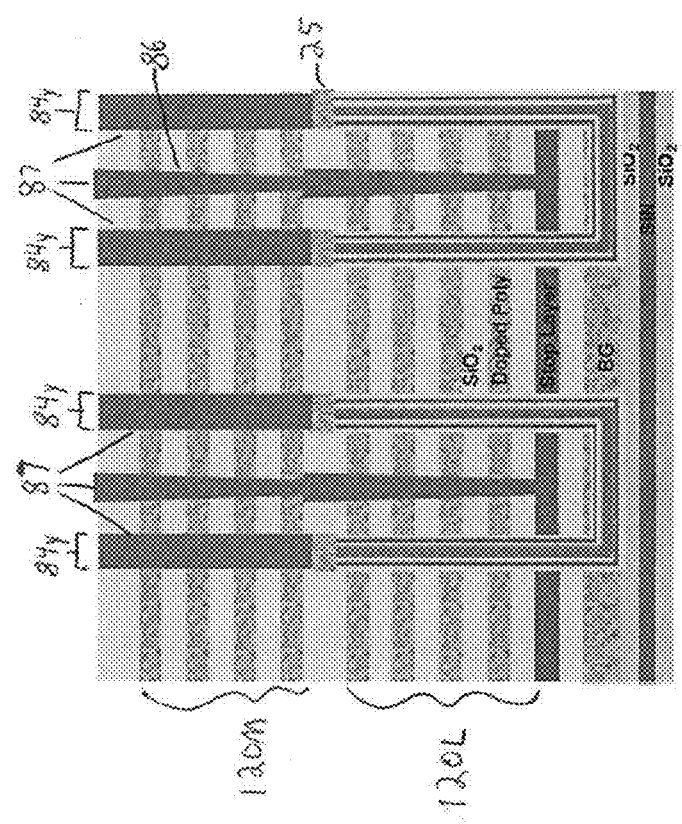

As illustrated in FIG. 20H, the top layer of dielectric fill material 121 on the middle stack 120M is partially removed to form exposed pillars of dielectric material 87 above the memory holes 84y and the slit trenches 86. A hard mask 27C is then deposited over the top layer of dielectric fill material 121 and the exposed pillars of dielectric material. Next, as illustrated in FIG. 20I, the hard mask 27C is patterned to form holes exposing the dielectric material in the memory holes. The dielectric material 87 in the memory holes is removed through the holes in the hard mask 27C. Next, blocking dielectric 7, charge storage material 9, tunnel dielectric 11 and channel 1 are deposited in the memory holes. After filling the memory holes, a layer of dielectric material 121 is deposited over the middle stack 120M. A CMP process may then be used to planarize the surface of the middle stack 120M and the expose the surface of the dielectric material 87 in the slit trenches 86 in the middle stack 120M.

Next, as illustrated in FIG. 20J, the top layer of dielectric material 121 on the stack 121M may be patterned and etched with holes to expose the top surfaces of the blocking dielectric 7, charge storage material 9, tunnel dielectric 11 and channel 1 in the memory holes. Landing pads 25 may then be formed on the top of the blocking dielectric 7, charge storage material 9, tunnel dielectric 11 and channel 1 in the memory holes in the middle stack 120M by depositing a conducting or semiconducting material in the holes in the patterned top layer of dielectric material 121. Additional memory stacks 120 as desired may be formed by repeating the steps above. After forming the last desired memory stack, source lines 102 and bit lines 202 may be formed as described in regards to the embodiment illustrated in FIG. 19D.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a vertical NAND device, comprising:
    forming a lower portion of a memory stack over a substrate;
    forming a lower portion of memory openings in the lower portion of the memory stack;
    widening a top part of the lower portion of the memory openings;
    forming at least one additional portion of the memory stack over the lower portion of the memory stack;
    forming at least one additional portion of the memory openings in the at least one additional portion of the memory stack;
    forming a lower portion of the semiconductor channels in the lower portion of the memory openings;
    forming semiconductor or electrically conductive landing pads in the widened top parts of the lower portion of the memory openings, wherein the landing pads have a larger width than a widest portion of the memory openings and are in contact with the lower semiconductor channel portions; and
    forming at least one additional portion of the semiconductor channels in the at least one additional portion of the memory openings, such that the at least one additional portion of the semiconductor channels contacts the respective landing pads.

2. The method of claim 1, wherein the at least one additional portion of the memory stack comprises an upper portion of the stack, and the at least one additional portion of the memory openings comprises an upper portion of the memory openings.

3. The method of claim 1, wherein the memory stack contains more than two portions, the at least one additional portion of the memory stack comprises one or more middle portions and an upper portion of the stack, and the at least one additional portion of the memory openings comprises one or more middle portion and an upper portion of the memory openings.

4. The method of claim 1, wherein the lower portion of the memory openings is formed by etching using a first hard mask, and the at least one additional portion of the memory openings is formed by etching using at least one second hard mask different from the first hard mask.

5. The method of claim 1, wherein the lower and the at least one additional portions of the memory stack comprise alternating insulating and sacrificial layers, and wherein the sacrificial material layers are removed and replaced with a memory film and control gate electrodes.

6. The method of claim 1, wherein the lower and the at least one additional portions of the memory stack comprise alternating insulating and control gate material layers.

7. The method of claim 1, further comprising forming a memory film which comprises at least one charge storage region located between blocking and tunneling dielectric layers.

8. The method of claim 7, wherein:
    the lower portion of the channels are formed in the lower portion of the memory openings prior to forming the at least one additional portion of the memory stack;
    the landing pads are formed after forming the lower portion of the channels prior to forming the at least one additional portion of the memory stack;
    the at least one additional portion of the stack is formed over the landing pads;
    the at least one additional portion of the memory openings are formed to expose the landing pads; and
    the at least one additional portion of the channels are formed in contact with the landing pads.

9. The method of claim 1, further comprising forming a current boosting layer electrically connected to the landing pads, wherein the landing pad is thicker than the current boosting layer.

10. The method of claim 1, wherein:
    the landing pad is located between an upper select gate electrode of an upper select transistor in the at least one additional portion of the memory stack and an uppermost control gate electrode in the lower portion of the memory stack; and a channel of the upper select transistor is formed by a non-damascene process.

11. A method of making a vertical NAND device, comprising:

forming a lower portion of the memory stack over a substrate;

forming a lower portion of memory openings in the lower portion of the memory stack;

forming at least one additional portion of the memory stack over the lower portion of the memory stack;

forming at least one additional portion of the memory openings in the at least one additional portion of the memory stack;

forming a lower portion of the semiconductor channels in the lower portion of the memory openings;

forming semiconductor or electrically conductive landing pads in contact with the lower semiconductor channel portions;

forming at least one additional portion of the semiconductor channels in the at least one additional portion of the memory openings, such that the at least one additional portion of the semiconductor channels contacts the respective landing pads;

filling lower parts of the lower portion of the memory openings with a sacrificial material;

widening remaining exposed top parts of the lower portion of the memory openings where the landing pads will be subsequently formed; and filling the widened top parts of the lower portion of the memory openings with a sacrificial material.

12. The method of claim 11, wherein:

the at least one additional portion of the stack is formed over the lower portion of the stack containing the lower portion of the memory openings filled with the sacrificial material; and the at least one additional portion of the memory openings is formed by etching the additional portion of the memory stack to expose the sacrificial material in the top part of the lower portion of the memory openings.

13. The method of claim 12, further comprising removing the sacrificial material from the entire memory openings and forming entire memory films in the memory openings.

14. The method of claim 13, wherein the lower portion of the channels, the landing pads and the at least one additional portion of the channels are formed in the memory openings in the same growth step, such that entire channels and the landing pads built into the channels are formed in one step.

15. The method of claim 14, wherein:

the semiconductor channel has a U-shaped side cross section;

two wing portions of the U-shaped semiconductor channel extend substantially perpendicular to a major surface of the substrate are connected by a connecting portion which extends substantially parallel to the major surface of the substrate; and an insulating fill is located over the connecting portion and separating two wing portions of the U-shaped semiconductor channel.

16. The method of claim 15, wherein the device further comprises:

a tunnel dielectric portion of the memory film located adjacent to the semiconductor channel;

a charge storage region portion of the memory film located adjacent to the tunnel dielectric;

a blocking dielectric portion of the memory film located adjacent to the charge storage region; and a plurality of control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level.

17. The method of claim 13, wherein the device further comprises:

a tunnel dielectric located adjacent to the semiconductor channel;

a charge storage region located adjacent to the tunnel dielectric;

a blocking dielectric located adjacent to the charge storage region; and a plurality of control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level.

18. The method of claim 17, wherein the lower portion of each of the memory openings is misaligned with respect to the respective at least one additional portion of each of the memory openings.

19. The method of claim 17, wherein the device comprises at least a 3×3 array of NAND strings, the first control gate electrode and the second control gate electrode are continuous in the array, and the first control gate electrode and the second control gate electrode do not have an air gap or a dielectric filled trench in the array.

20. The method of claim 17, wherein:

each semiconductor channel has a pillar shape; and the entire pillar-shaped semiconductor channel extends substantially perpendicularly to the major surface of the substrate.

21. The method of claim 13, further comprising forming a current boosting layer comprising a conductive or semiconducting material electrically connected to the landing pads.

22. The method of claim 13, wherein the memory films comprise at least one charge storage region.

* * * * *